United States Patent
Korec et al.

(10) Patent No.: US 9,385,196 B2
(45) Date of Patent: Jul. 5, 2016

(54) FAST SWITCHING IGBT WITH EMBEDDED EMITTER SHORTING CONTACTS AND METHOD FOR MAKING SAME

(75) Inventors: Jacek Korec, Sunrise, FL (US); John Manning Savidge Neilson, Norristown, PA (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 591 days.

(21) Appl. No.: 13/611,653

(22) Filed: Sep. 12, 2012

(65) Prior Publication Data

US 2014/0070265 A1    Mar. 13, 2014

(51) Int. Cl.
  *H01L 29/739*    (2006.01)
  *H01L 21/331*    (2006.01)
  *H01L 29/08*    (2006.01)
  *H01L 29/66*    (2006.01)

(52) U.S. Cl.
  CPC ...... *H01L 29/0834* (2013.01); *H01L 29/66333* (2013.01); *H01L 29/7395* (2013.01)

(58) Field of Classification Search
  CPC ............ H01L 29/0696; H01L 29/1095; H01L 29/66325; H01L 29/7393; H01L 29/7397; H01L 2924/13055
  USPC .......................................... 257/139; 438/133
  See application file for complete search history.

(56) References Cited

U.S. PATENT DOCUMENTS

| | | | | |
|---|---|---|---|---|
| 3,727,116 | A * | 4/1973 | Thomas | H01L 21/00 257/121 |
| 5,323,059 | A * | 6/1994 | Rutter | H01L 21/2007 257/139 |
| 5,548,133 | A | 8/1996 | Kinzer | |
| 7,470,952 | B2 | 12/2008 | Ruething et al. | |
| 8,022,474 | B2 * | 9/2011 | Haeberlen | H01L 29/7813 257/331 |
| 8,344,415 | B2 * | 1/2013 | Ruething et al. | 257/139 |
| 8,461,620 | B2 * | 6/2013 | Glidden | G02F 1/00 257/116 |
| 2007/0114607 | A1 | 5/2007 | Pendharkar | |
| 2008/0315251 | A1 | 12/2008 | Lee | |
| 2010/0032713 | A1 | 2/2010 | Kawahara et al. | |
| 2010/0219446 | A1 | 9/2010 | Chen | |
| 2012/0286323 | A1* | 11/2012 | Werber | 257/139 |

OTHER PUBLICATIONS

Icemos Technology Ltd:http://www.icemostech.com/ice/Product_Briefs/Si-Siwafers.pdf, obtained from internet on Aug. 23, 2012.
Sorab K. Ghandi, "Semiconductor Power Devices", 1977, pp. 206-207.
B.J. Baliga, "Power Semiconductor Devices", 1996, pp. 269-295.

* cited by examiner

Primary Examiner — Thomas L Dickey
Assistant Examiner — Damon Hillman
(74) Attorney, Agent, or Firm — Jacqueline J. Garner; Frank D. Cimino

(57) ABSTRACT

Integrated circuits are presented having high voltage IGBTs with integral emitter shorts and fabrication processes using wafer bonding or gown epitaxial silicon for controlled drift region thickness and fast switching speed.

10 Claims, 20 Drawing Sheets

FAST SWITCHING IGBT WITH EMBEDDED EMITTER SHORTING CONTACTS AND METHOD FOR MAKING SAME

FIELD OF THE INVENTION

The present disclosure relates to the field of integrated circuits, and more particularly to fast switching insulated gate bipolar transistor (IGBT) devices with embedded emitter shorting contacts.

BACKGROUND OF THE INVENTION

IGBTs include a bipolar transistor and a MOSFET. The bipolar emitter is on the bottom of the device (although in various descriptions, the bottom terminal is sometimes referred to as a "collector" where the IGBT high-voltage terminal (the IGBT collector) is connected to the region which functions as the emitter of the integral bipolar transistor), and operates to inject minority carriers into the bipolar base, thereby filling this region with a plasma of holes and electrons to facilitate high current density. Bipolar conduction in IGBTs provides an advantage in terms of current per unit area, but results in a disadvantage in terms of switching speed. The excess carriers in the hole-electron plasma do not instantaneously disappear after the current has stopped flowing, and the device cannot return to the off-state and support a high voltage with low leakage until the excess carriers are gone. Therefore, if the device is to be designed for fast switching, it is necessary to build in a mechanism to provide rapid removal of excess carriers.

Current is carried by both holes and electrons in bipolar devices having an emitter region of one conductivity type adjacent a base region of the opposite conductivity type. During conduction, the emitter injects its majority carriers as minority carriers into the base region. Entry of these minority carriers into the base permits the entrance of equal quantities of base majority carriers, and thus the total carrier concentration in the base region can rapidly exceed the base dopant concentration. The result is conductivity modulation of the base region, in which the base conductivity becomes much higher, and resistivity much lower, than the background value. This conductivity-modulated bipolar conduction advantageously permits the device to carry a much higher current density than a similar unipolar device. In an IGBT, the emitter operates to emit carriers into a voltage supporting region at the bipolar base, and fast switching IGBTs can be built using emitter shorting contacts connecting the emitter to the base for excess carrier removal to turn the device off quickly. In general, a resistor or low impedance contact can be provided between the emitter and the base, in parallel with the emitter-base junction. This emitter-base shunt resistor may be connected externally, or may be built into the structure.

The excess carriers can thus be removed quickly from base region to interrupt the current flow for fast switching applications. One way to do this is to create recombination centers to provide mid-band energy levels where holes and electrons can recombine. Recombination centers can be provided by doping the crystal with heavy metals, such as gold or platinum, or by bombarding the crystal with high energy neutrons, protons, electrons, or gamma rays to produce localized damage sites. Shorted emitters have several advantages over recombination centers. Recombination centers are more effective at removing carriers at high carrier densities than at low densities, while emitter shorts are more effective at low carrier densities, which is the condition during switching. As carrier density increases, more carriers encounter recombination centers and recombine, but this limits the level of conductivity modulation, and thereby increases the on-voltage. Emitter shorts have better impact at low carrier densities. When current is low enough that the voltage drop on the emitter-shorting resistor is less than the 0.6-0.8 volt built-in offset voltage of the junction, almost all majority carriers flow through the shorting contact or resistor rather than crossing the junction and injecting minority carriers. With only recombination centers, majority carriers continue crossing the junction and injecting minority carriers even down to very low current levels, thereby slowing the device turn-off. With the emitter shorts, minority carrier injection ceases as soon as the drop across the shorting resistor falls below the 0.6-0.8 volt level. Emitter shorts thus reduce the low-current gain, but have only a small effect on high current gain.

High voltage IGBT devices are used to switch high voltage electrical power, and certain applications require fast switching times for both turn-on and turn-off. For a given switching speed, an IGBT made with emitter shorts can have a lower on-voltage at both low-current and high-current levels than an IGBT made with only recombination centers. However, high voltage devices with high switching speeds require control over the drift region thickness, and conventional techniques provide no way for backside processing to create emitter shorts for devices with fairly thin drift regions necessary to achieve high switching speeds.

SUMMARY OF THE INVENTION

Various aspects of the present disclosure are now summarized for compliance with 37 CFR §1.73 to facilitate a basic understanding of the disclosure by briefly indicating the nature and substance of the disclosure, wherein this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter, and this summary is submitted with the understanding that it will not be used to interpret or limit the scope or meaning of the claims.

Integrated circuits (ICs) and fabrication processes are provided for making IGBTs with emitter shorting contact structures for fast switching speeds, and controlled drift region thickness using bonded wafers and/or epitaxially grown silicon. ICs are provided having IGBT emitters and one or more associated shorting contacts formed proximate a joinder interface of two bonded wafers or beneath an epitaxially grown silicon drift region. The drift region thickness is controlled in certain embodiments by selective material removal processing after MOS structure formation and/or by control of an epitaxial growth process. IGBTs are thus provided having relatively thin drift regions of about 100 µm or less in certain embodiments for achieving high switching speed operation by the provision of one or more emitter shorting contacts. The disclosed embodiments advantageously combine these two advantages in a manner not previously possible using conventional fabrication techniques.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
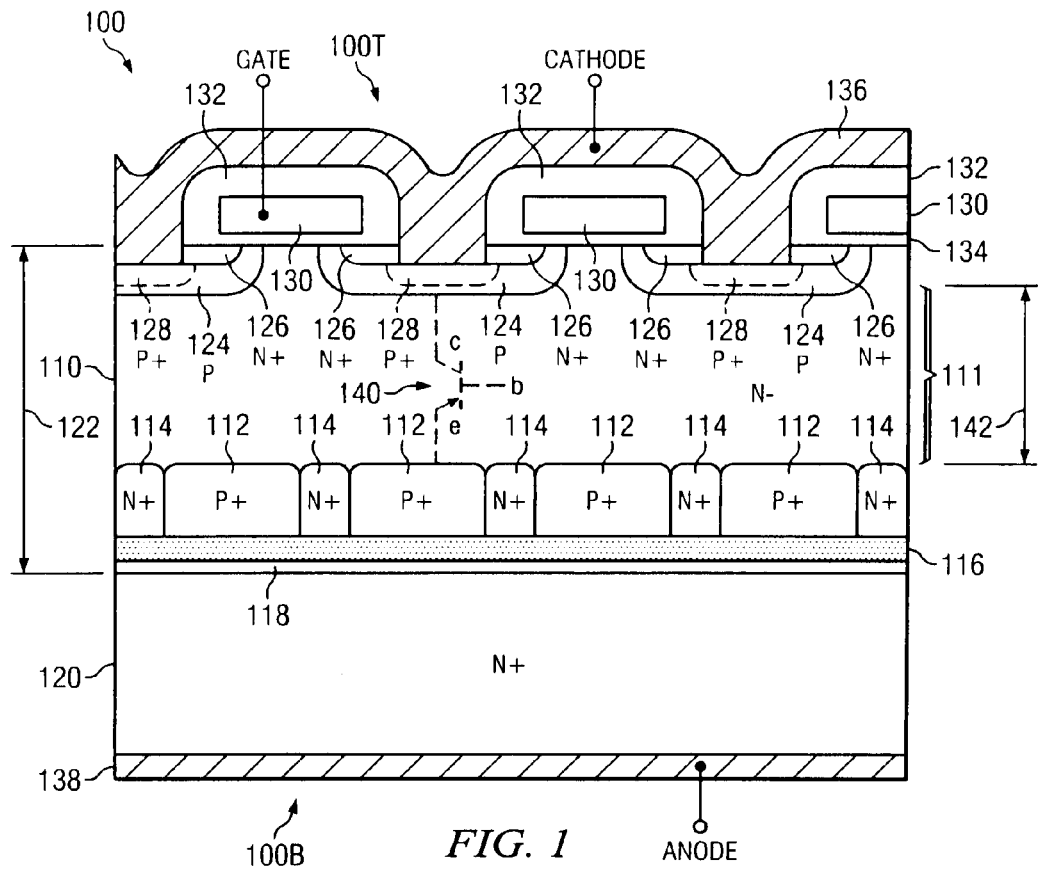
FIG. 1 is a partial sectional side elevation view illustrating a bonded wafer integrated circuit with an insulated gate bipolar transistor (IGBT) having emitter shorting contacts formed at the bottom of an upper wafer according to one or more principles of the present disclosure.

One or more embodiments or implementations are hereinafter described in conjunction with the drawings, wherein like reference numerals are used to refer to like or similar elements throughout. The various features are not necessarily drawn to scale and are provided merely to illustrate the various concepts of the present disclosure. Several aspects of the invention are described below with reference to example applications for illustration. It should be understood that numerous specific details, relationships, and methods are set forth to provide a full understanding of the disclosed concepts. One skilled in the relevant art, however, will readily recognize that these concepts can be practiced without one or more of the specific details or with other methods. In other instances, well-known structures or operations are not shown in detail to avoid obscuring the disclosed apparatus and processes, wherein the present disclosure is not limited by the illustrated ordering of acts or events, as some acts may occur in different orders and/or concurrently with other acts or events. Furthermore, not all illustrated acts or events are required to implement a methodology in accordance with the present disclosure.

High voltage IGBT devices are used to switch high voltage electrical power, and certain applications require fast switching times for both turn-on and turn-off. As seen in the several embodiments below, high voltage IGBTs can be created by using wafer bonding and material removal processing and/or via epitaxial growth to facilitate the ability to create emitter shorts as well as to control drift region thickness for fast switching and to accommodate a given target breakdown voltage rating, for instance less than about 100 µm (e.g. about 40-50 µm in further embodiments). These integrated circuit structures and fabrication processes represent a significant advance over conventional semiconductor manufacturing techniques which do not allow for back side processing of a very thin wafer (e.g. 50-100 µm or less).

The inventors have appreciated that, particularly at low current levels, the described shorted emitter IGBTs have a lower on-voltage and fast turn-off times because the emitter short provides a path through which current can flow around the emitter junction instead of having to flow across the 0.6-0.8 volt offset voltage of the junction. At high current levels, a emitter-shorted IGBT can have a lower on-voltage because it can allow a higher level of conductivity modulation than can an IGBT with only recombination centers. Several embodiments and different exemplary fabrication processes are illustrated and described hereinafter, some of which involve use of bonded wafer processing techniques and some using epitaxial growth processing to facilitate drift region dimensional control for fast switching speeds.

A first embodiment is illustrated and described in connection with FIGS. 1-9 including an integrated circuit 100 with a shorted emitter IGBT device fabricated using wafer bonding techniques and selective back grinding to provide a thin N– drift region (e.g., 40-50 µm) for high voltage operation (e.g., >about 600 V) and high switching speed. In this embodiment, P+ emitter regions 112 and one or more N+ shorting contacts are formed in an upper N-wafer prior to joinder with a carrier wafer. Further embodiments are illustrated with respect to FIGS. 10-19, in which P+ emitter regions 212 or N+ shorting contacts are formed in silicided trenches in an upper side of the carrier wafer prior to wafer bonding, and the upper wafer thickness is reduced prior to MOS structure formation. FIGS. 20-27 depict another example with P+ emitter and N+ shorting contacts formed in an upper N– wafer, followed by bonding to a lower carrier wafer. MOS cell structures are thereafter built on/in an upper side of the upper wafer, after which the sacrificial carrier wafer is back ground to expose the P+ emitters and N+ shorting contacts before metallization processing. Further embodiments are illustrated in FIGS. 28-35 in which the emitters and shorting contact(s) are formed in the upper side of an N+ wafer, and N– epitaxial silicon is grown above the emitters and shorting contacts, with the MOS structures formed in the top of the epitaxial layer prior to back grinding to expose the emitters and shorting contacts, followed by metallization processing.

Other implementations of these techniques can be used to provide other relatively thin drift region IGBT structures, for example, less than about 100 µm for any desired switching speed and breakdown voltage. Moreover, the upper wafer, lower carrier wafer, epitaxially grown silicon, emitter structures, shorting contacts structures and/or the MOS structures including source regions and body regions can be of a variety of combinations of different conductivity types, wherein the complementary conductivity type combinations are also contemplated as falling within the scope of the present disclosure. In this regard, integrated circuits are contemplated including IGBTs having PNP bipolar devices as illustrated, as well as implementations having NPN bipolar transistors with a base formed in a P type semiconductor body such as an upper wafer and/or epitaxial silicon, and the present disclosure is not limited to the illustrated examples in which an N-upper wafer and/or N type epitaxial silicon is used.

Referring now to FIGS. 1-9, An integrated circuit (IC) 100 is shown in FIG. 1 with an insulated gate bipolar transistor (IGBT) including a vertical PNP bipolar transistor 140 along with one or more lateral N channel MOSFET cells in the region of an upper or top side of the IC 100 to control the base "b" of the bipolar transistor 140 to form an IGBT. Each of the MOSFET cells provides an N+ source zone or region 126 and a P body zone or region 124 arranged between the source zone 126 and a drift zone or voltage supporting region 111 having a thickness 142 of less than about 100 µm in an N− semiconductor body 110 (e.g., N− silicon in certain embodiments). The drift region thickness 142 in certain embodiments is about 50 µm or less, for example, about 40-50 µm in specific embodiments for enhanced switching speed. The drift region thickness 142, moreover, can be set according to a desired breakdown voltage rating for the resulting IGBT, for example, with about 10-20 V per µm thickness being a general design guideline for silicon.

The IGBT may have any number of symmetrically disposed parallel P type body regions 124 diffused into the upper region of the N− semiconductor body 110. Each of the P diffusions 124 has an N+ source region 126 to form annular or striped channel regions within the respective P diffusion 124, where the channel regions are covered by a gate oxide 134 which is, in turn, covered by a conductive polysilicon and/or metal gate contact 130. An interlayer oxide or dielectric (ILD) 132 covers the top and sides of the gate 130. A conductive cathode electrode 136 is connected to P+ regions 128 within the P+ body region diffusions 124 and to the N+ source regions 126. An IGBT anode connection 138 along a bottom side 100B of the integrated circuit 100 establishes an emitter structure including multiple P+ emitter regions 112 coupled to an N+carrier wafer structure 120 via a silicide layer 116 and an optional polysilicon layer 118, where the emitter regions 112 emit holes in operation.

The IGBT in FIG. 1 also includes shorting contacts formed as N+ regions 114 serving as emitter shorting contacts between the N− body 110 (the vertical bipolar base b) and the associated P+ emitter regions 112. Any number of one or more shorting contacts 114 can be provided, and multiple contacts 114 are preferably interleaved with corresponding emitter regions 112 as shown, although not a strict requirement of all the possible implementations of the concepts of present disclosure. The collector bipolar (cathode) connection is made by a conductive metallization layer 136 shown at a top side 100T of the integrated circuit 100 in FIG. 1 and the emitter (anode) is at the bottom 100B, which operates to emit holes to the N− region (bipolar base) in the IGBT. In the embodiment of FIG. 1, moreover, a silicide layer 116 is provided in certain embodiments beneath the P+ emitter regions 124 and the N+ emitter shorting contacts 126, and a thin polysilicon layer 118 may be disposed between the silicide layer 116 and an N+carrier wafer 120 bonded along an interface to the polysilicon 118 during fabrication. The silicide layer 116 and/or the polysilicon layer 118 may be omitted in certain embodiments. A conductive anode contact layer 138 is formed at the bottom of the carrier wafer 120. External contacts for the gate structures 130 are provided by further metallization structures (not shown) along the top side 100T, whereby the integrated circuit 100 provides connectivity to the gate, collector (cathode) and emitter (anode) terminals of the resulting IGBT.

The IGBT structure of the integrated circuit 100 advantageously provides a voltage supporting region having a vertical dimension 142 extending between the bottom of the P+ regions 128 and the tops of the P+ emitter regions 112 of less than about 100 µm in certain embodiments, about 50 µm in certain embodiments, about 40-50 µm in further embodiments. This controlled dimension 142 of less than about 100 µm provides faster switching speeds and also sets the voltage breakdown rating for the IGBT, for example, greater than about 300 V for about 20-30 µm or more, about 600 V or more for about 40-50 µm thickness 142, about 1000 V or more for about 100 µm or more in certain examples.

In operation, when a positive voltage is applied to gate electrode 130, the P type channel region of each cell inverts to connect the N+ sources 126 to the N− body 110 of the drift region 111, which is the base of the PNP transistor 140 having P diffusions (collectors) 124. The P+ emitter regions 112 begin to inject holes into the N− region 110 to turn on the PNP transistor 140 over the full surface area of each cell. The device is turned off by removal of the signal to the gate 130, thereby removing the base drive from region 110. The injected holes in the N− region 110 are then removed and the bipolar transistor 140 turns off, with conduction through the shorting contacts 114 speeding the carrier removal from the base for fast turn-off.

Figure 3:
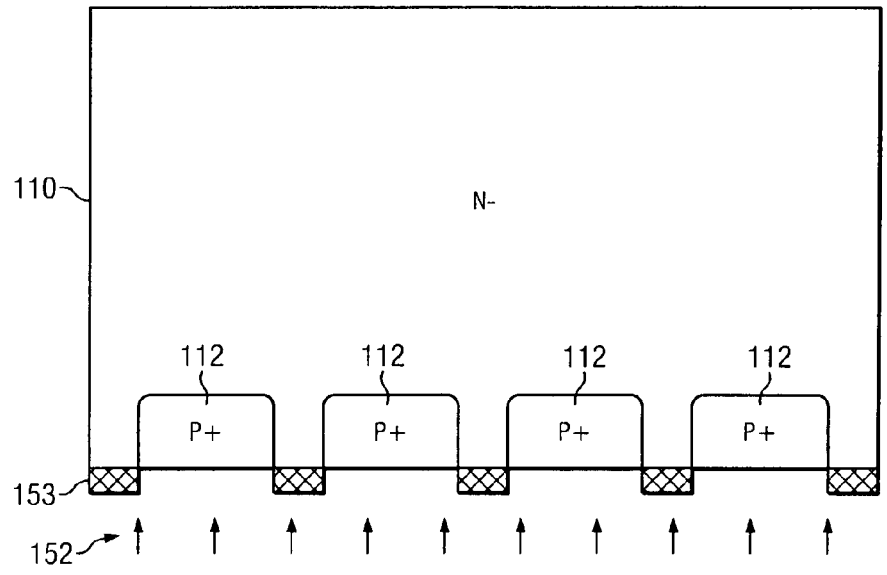
FIGS. 3-9 are partial sectional side elevation views illustrating the integrated circuit of FIG. 1, depicted in successive stages of fabrication.
Figure 2:
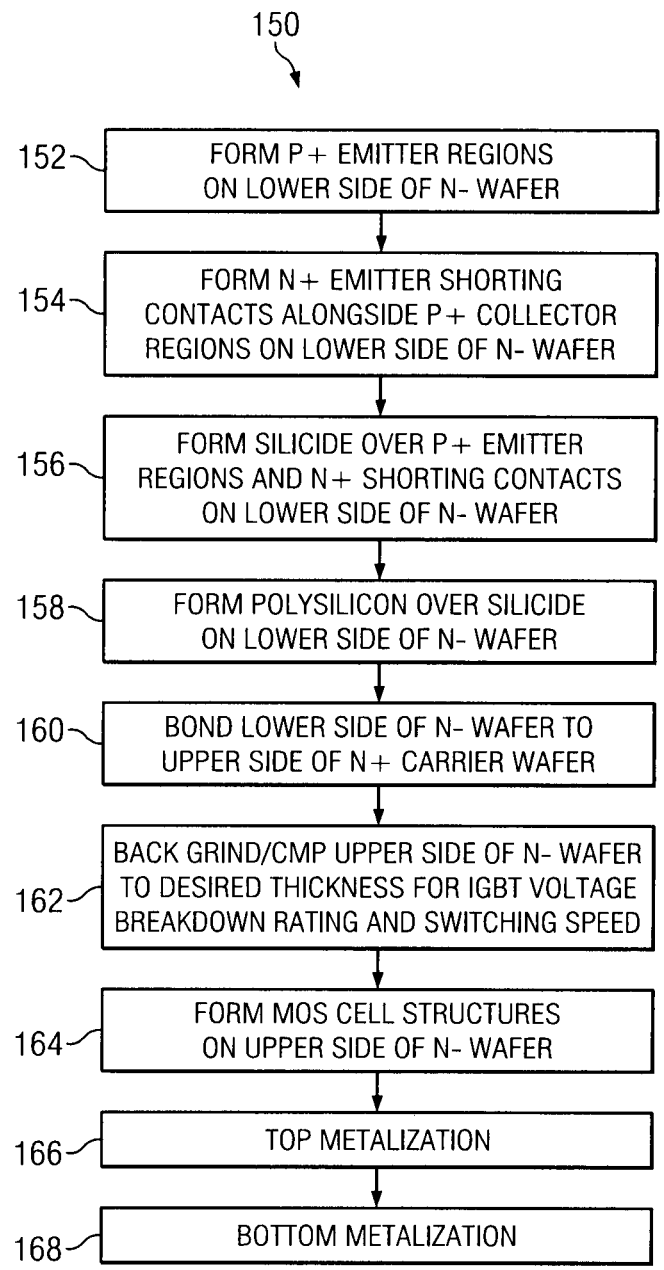
FIG. 2 is a flow diagram illustrating an exemplary process for making the integrated circuit of FIG. 1.
Figure 4:
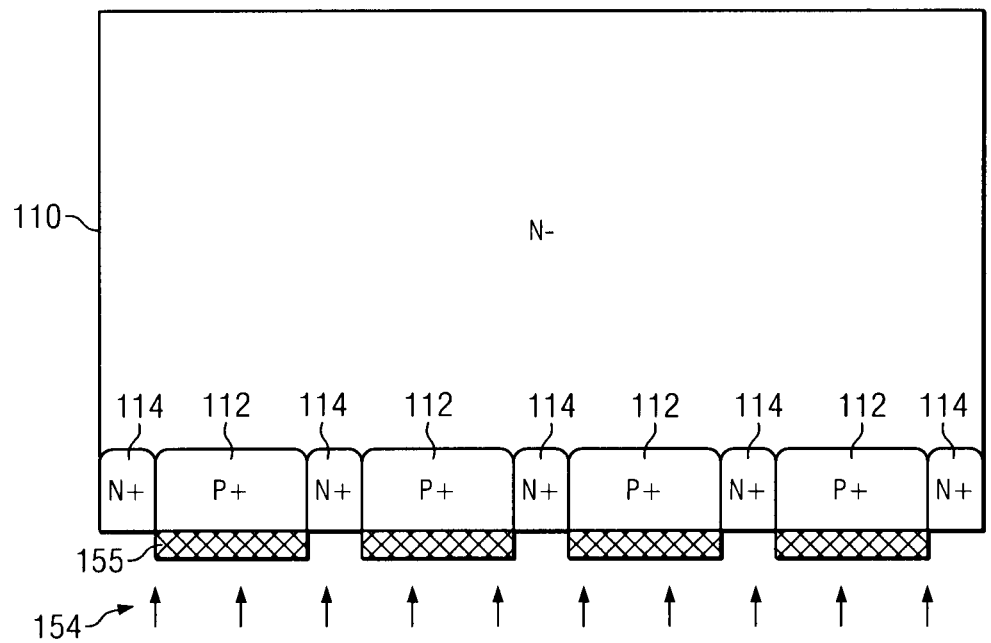
Figure 5:
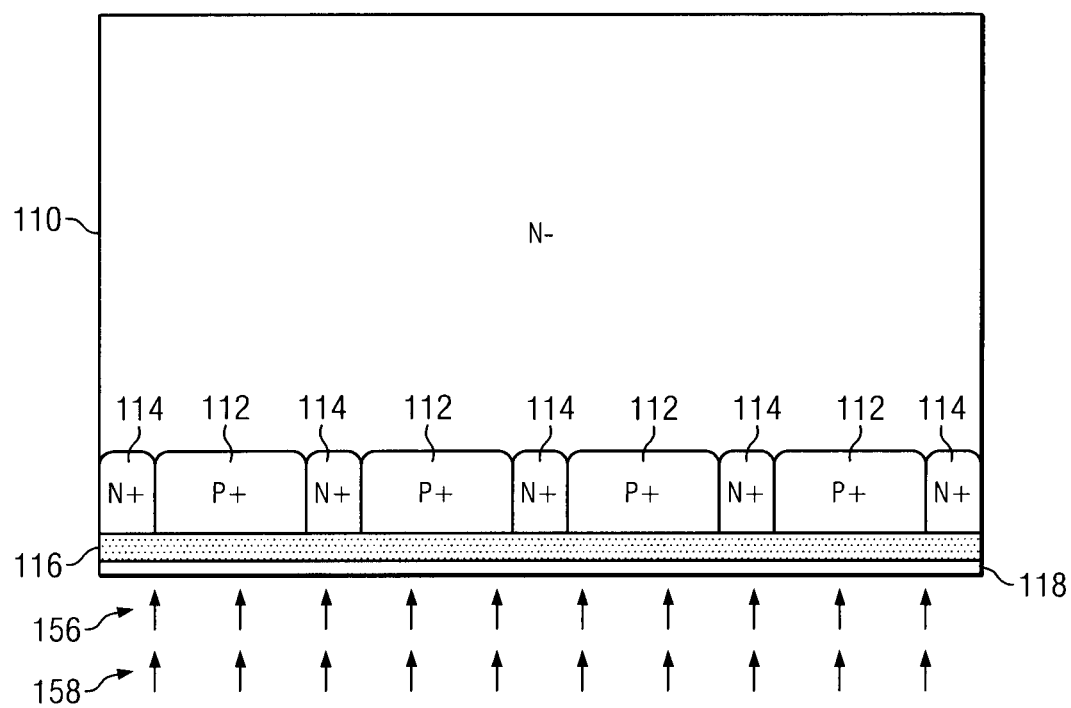
Figure 6:
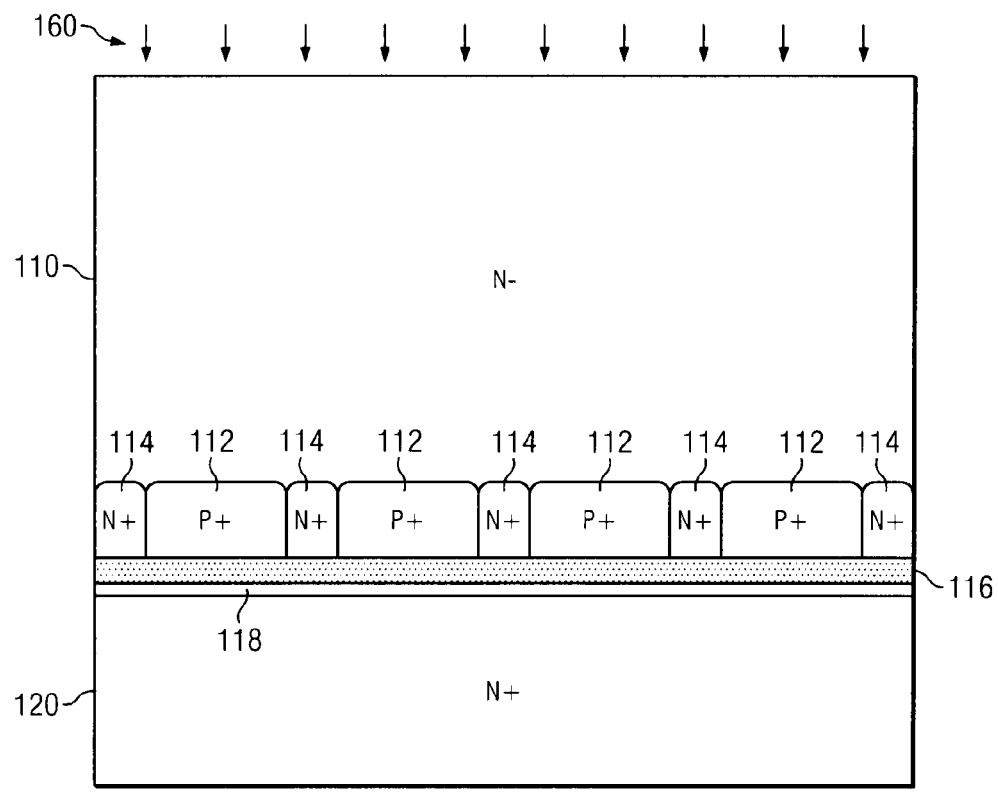
Figure 7:
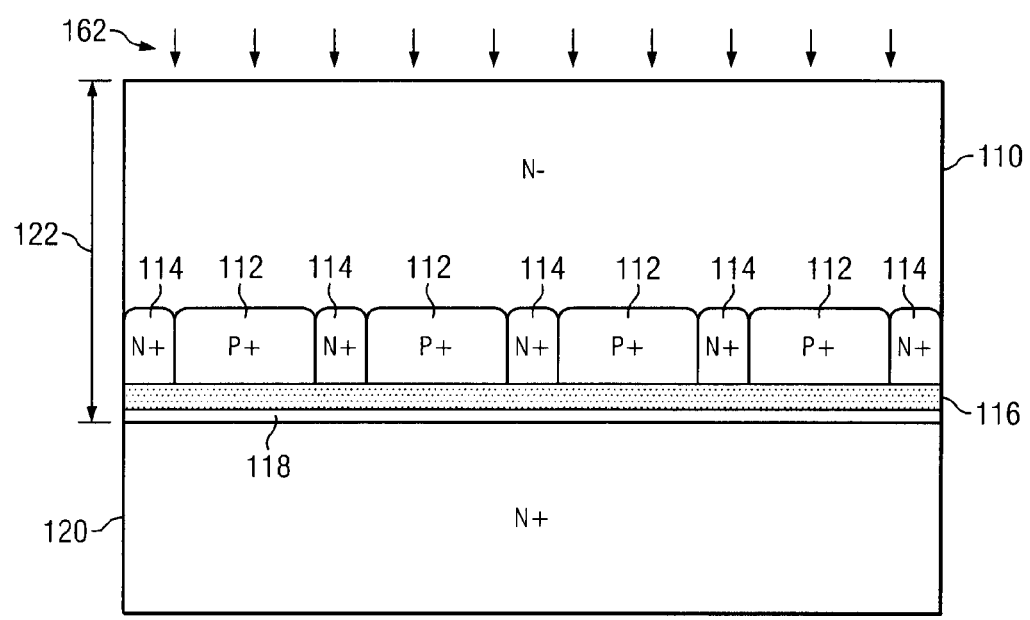

FIG. 2 illustrates an exemplary process 150 for manufacturing the integrated circuit 100 of FIG. 1, and FIGS. 3-9 show the IC 100 at successive stages of fabrication. Processing begins at 152 in FIG. 2 with formation of a plurality of P+ emitter zones 112 at 152 in the lower side of an N− silicon wafer or other suitable upper semiconductor structure 110. Any suitable process can be used at 152, for example, such as an implantation process 152 using an implant mask 153 as illustrated in FIG. 3. At 154 in FIG. 2, one or more N+ shorting contacts 114 is/are formed in the lower side of the wafer 110, for instance using a second implant mask 155 and corresponding implantation process as illustrated in FIG. 4. The individual shorting contacts 114 are proximate one or more corresponding emitter zones 112 along the lower side of the wafer 110, wherein the relative sizing in the widths of the emitters 112 and the shorting contacts 114 can be tailored to specific applications. In addition, the implanted regions 112 and 114 may be of any suitable depth, and need not be of the same depth. In certain embodiments, the P+ and N+ regions 112 and 114 respectively form emitters 112 and shorting contacts 114 on the bottom surface of the wafer 110, and may be formed by implantation with dopants selected for bonding with a lightly doped N− wafer 110, such as using boron for the P+ emitter implants 112 and phosphorus for the N+ shorting contact implants 114, both to a depth of about 1-5 µm at high doping concentrations, e.g., about 1e19 cm−3 in one possible implementation. Any suitable photolithographic processes may be used to form and subsequently remove the implant masks 153 and 155, and any suitable additional processing may be employed, such as for example, activation anneals following one or both of the implantations.

At 156 in FIG. 2, a silicide layer is formed over the emitter zones 112 and the shorting contact regions 114 at the lower side of the upper wafer structure 110 using any suitable silicide formation techniques. In one possible example, silicide is formed at 156 (e.g. Titanium Silicide $TiSi_2$, or Tungsten Silicide $WSi_x$) by chemical vapor deposition (CVD) using monosilane or dichlorosilane with tungsten hexafluoride as source gases, followed by annealing at 800-900° C. to create a conductive stoichiometric silicide layer 116 shown in FIG. 5. In another possible implementation, titanium or tungsten metal is sputter deposited onto the bottom of the implanted regions 112 and 114 and is then heated to a certain temperature (e.g.,) 800-900° to react the silicon with the deposited metal to form the silicide 116, preferably to a thickness of about several hundred angstroms. As further shown in FIG. 5, a polysilicon layer 118 may be optionally formed to any desired thickness over the silicide 116 via a process 158, followed by an optional annealing step (not shown). Also, a chemical mechanical polishing (CMP) process may be performed to create a smooth surface appropriate for wafer bonding, and hence the polysilicon layer 118 is preferably thin (e.g., a few hundreds of angstroms) following the CMP process to provide a high conductivity wafer boding interface while providing some silicon to facilitate bonding with a silicon carrier wafer 120.

The polished polysilicon surface 118 of the N− wafer 110 is then bonded with an N+ carrier wafer and the upper N− wafer 110 is thinned to the desired thickness to establish the thin IGBT drift region dimension 142 in FIG. 1 to facilitate fast switching operation. Following this thinning, the upper side of the N− wafer 110 is used to manufacture MOS gate structures where the processing temperature is limited in certain embodiments to about 950-1000° C. to preserve the metallic properties of the embedded silicide layer 116 and final metallization of the top and bottom are performed to provide the IC structure 100 of FIG. 1.

At 160 in FIG. 2, a wafer bonding step is carried out to join a second semiconductor structure (sometimes referred to herein as a carrier wafer) 120 (FIG. 6) to the lower side of the wafer 110. Any suitable wafer bonding process can be employed at 160 to bond the polysilicon surface 118 at the bottom of the N− wafer 110 to an N+ carrier wafer 120. In certain embodiments, for example, a low-temperature hydrophobic bonding process can be used at 160 to pressure bond the structures 110 and 120 together in a vacuum environment causing high-pressure, low-temperature bonding of silicon to silicon.

At 162 (FIGS. 2 and 7) a grinding or other material removal process is used to reduce the thickness of the N− structure 110 by removing material from the upper side, while leaving a remaining thickness 122 of about 105 µm or less. As noted above, high switching speed is facilitated by providing a drift region dimension 142 (FIG. 1) of less than about 100 µm, and the material removal process at 162 can establish this drift region thickness 142 in consideration of the formation of the emitter regions 112 to a depth of about 1-5 µm in certain embodiments. Other suitable remaining thicknesses 122 can be used, such as about 45-55 µm for embodiments in which a desired drift region thickness 142 of about 40-50 µm is desired, where the grinding operation 162 is preferably controlled in certain embodiments so as to set the final device drift region depth 142 taking into account the emitter structure thickness. Moreover, multiple steps can be performed at 162, including a mechanical back grinding operation followed by chemical mechanical polishing in certain embodiments.

Figure 8:
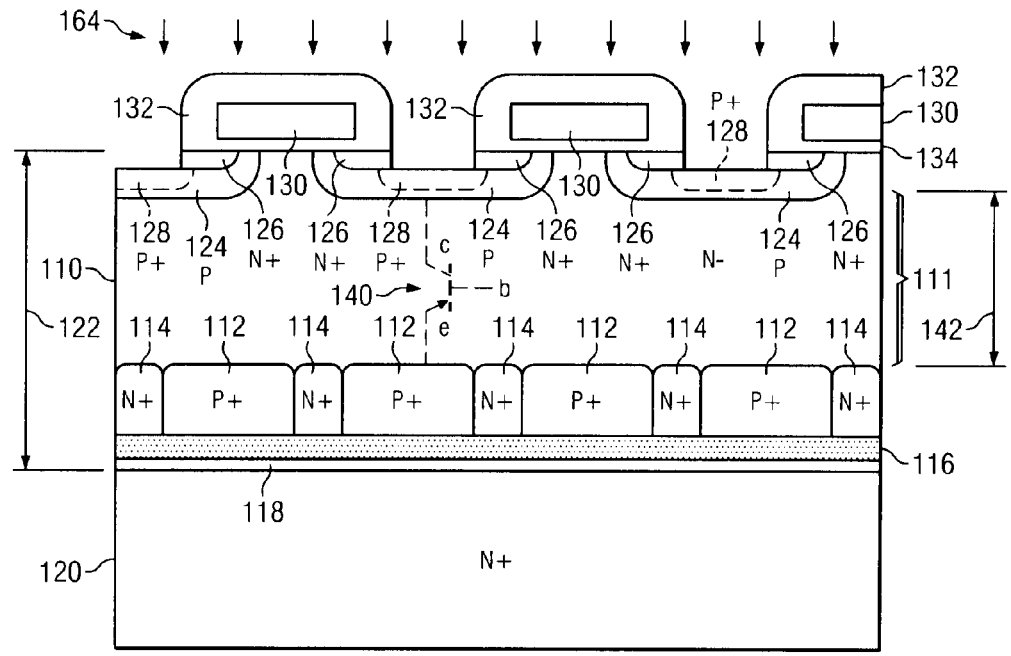
Figure 9:
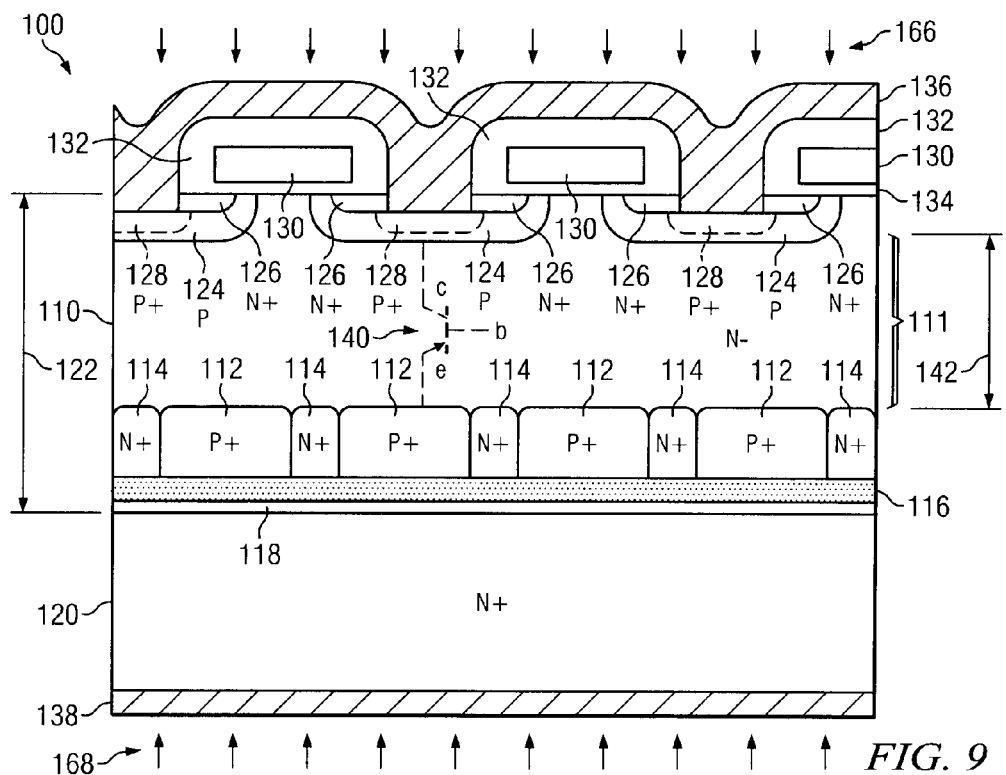

After the material removal, the process 150 proceeds with formation at 164 of one or more MOS cell structures on/in the upper side of the N-wafer 110, as seen in FIG. 8. In this regard, while the illustrated embodiments are shown as having horizontal channel MOSFET cells, vertical channel MOSFETs can be used in constructing an IGBT in alternative embodiments. Any suitable MOS processing steps may be employed at 164 in order to form P type body zones 124 and N+ source regions or zones 126, where the P body zones 124 (and optional P+ regions 128) are disposed between the N+ source zones 126 and the N− drift zone 111 in the remaining upper wafer 110. In one possible sequence, P type dopants (e.g., boron) are implanted to form the body regions 124 to any suitable dopant concentration and depth/profile, followed by implantation of N type dopants (e.g., phosphorus) with high dopant concentration such as 1e19 cm−3 in the upper side of the remaining (e.g., thinned) wafer structure 110 to form the N+ source regions 126, using any suitable masking structures and steps, as well as thermal annealing steps as are known. In certain embodiments, moreover, the MOS processing temperature is limited, for example, to about 950-1000° C. or less to preserve the metallic properties of any included embedded silicide layer 116. Thereafter, MOS gate processing is employed to form a gate dielectric 134 and at least one gate contact structure 130 proximate at least a portion of the source zone 126 which is insulated with respect to the source zones 126 and the body zones 124. Additional ILD processing is performed to create the dielectric 132. Thereafter, the top and bottom metallization processes are performed at 166 and 168, as seen in FIG. 9 in order to provide an upper source metal structure 136 providing a cathode connection to the source regions 126 and a separate metallization contact structure (not shown) for the gate 130 (e.g., FIG. 1), as well as a bottom (anode) metal layer 138 formed along the bottom of the N+ carrier wafer 120 for external connection to the IGBT emitters 112.

Figure 10:
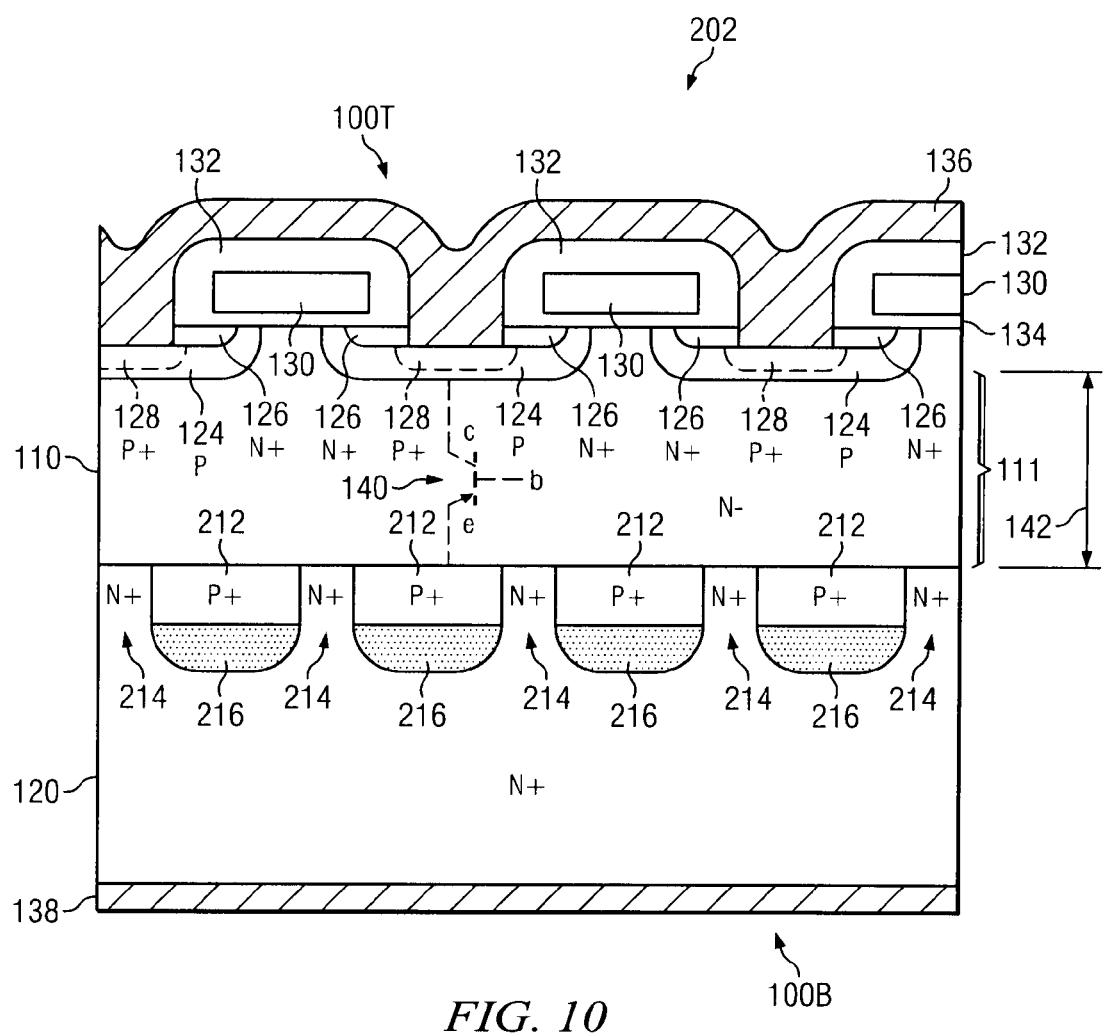
FIGS. 10 and 11 are partial sectional side elevation views illustrating further embodiments of a bonded wafer integrated circuit with an IGBT having emitter shorting contacts formed in the top of a lower carrier wafer according to principles of the present disclosure.
Figure 11:
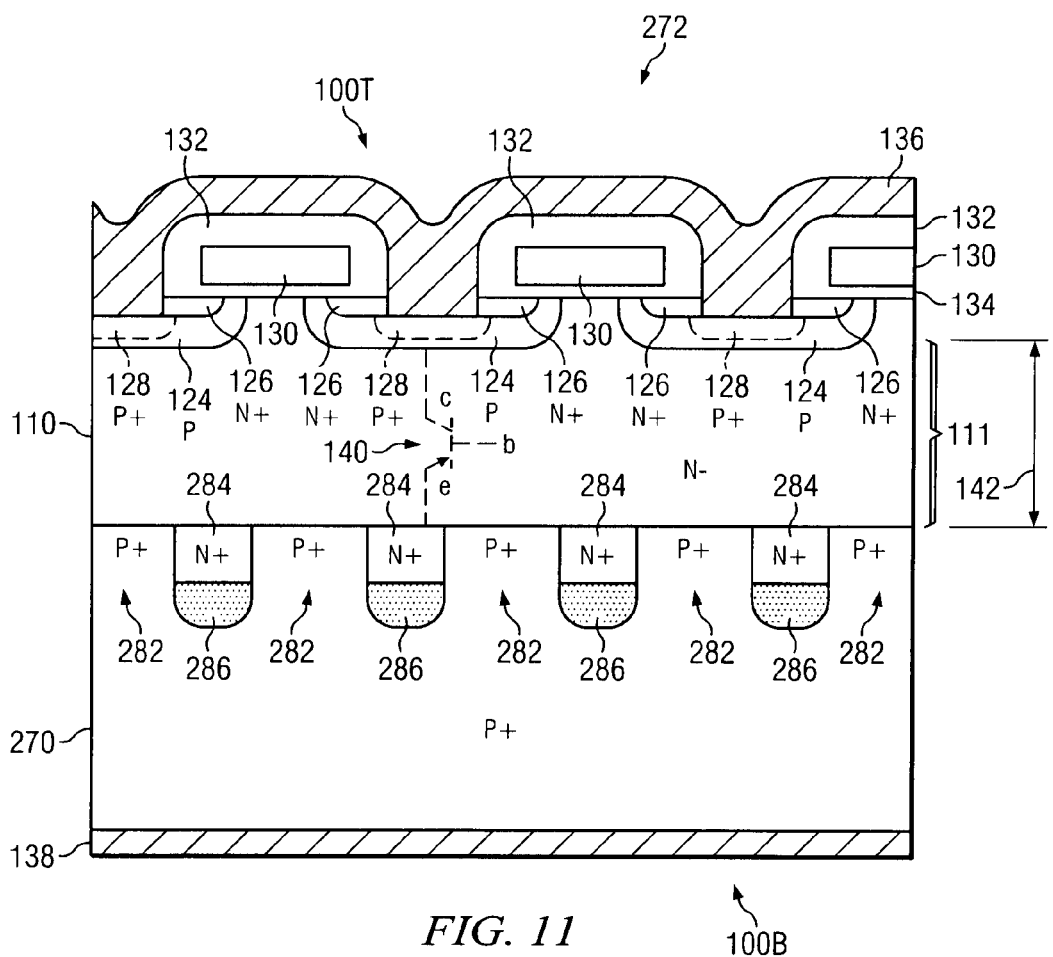

Referring now to FIGS. 10-19, FIG. 10 illustrates a second integrated circuit embodiment 202 with upper MOS cell structures and corresponding metallization formed at the top of a thinned N-silicon wafer structure 110 including an IGBT with various structures and operation as described above in connection with FIG. 1. The IC 202 in FIG. 10 includes a lower structure formed using an N+ carrier wafer 120 including trenches at the top of the carrier wafer 120 filled with P+ polysilicon 212 overlying silicide regions 216 at the bottom of the trenches to form alternating emitter structures 212 with interleaved N+ collector shorting contact regions 214 of the carrier 120, along with a bottom (anode) metallization contact layer 138. FIG. 11 illustrates a third IC embodiment 272 in which the lower structure is formed using a P+ carrier wafer 270 with upper trenches used to form N+ emitter shorting contacts 284 overlying silicide structures 286 at the bottom of the trenches, where the intervening P+ portions of the carrier wafer 270 provide the IGBT emitters 282. In these embodiments, the P+ emitter regions 212 (FIG. 10) or N+ shorting contacts 284 (FIG. 11) are formed in the silicided trenches on the upper side of the carrier wafer 120, 270 prior to wafer bonding, and the thickness of the bonded upper wafer 110 is then reduced prior to MOS structure formation. In this manner, the ICs 202, 272 can be provided with a controlled drift region thickness 142 less than about 100 µm in certain embodiments, about 50 µm in certain embodiments, about 40-50 µm in further embodiments to facilitate high switching speeds for the resulting IGBT. Moreover, the wafer bonding provides sufficient structure thickness to facilitate the MOS cell processing.

The second and third embodiments of FIGS. 10 and 11 each employ deposition of silicide into the bottom of shallow trenches, followed by filling the trenches with polysilicon and a CMP process to at least partially reveal the original silicon surface of the N+ carrier wafer 120 (FIG. 10) or of the P+ wafer 270 (FIG. 11). This approach may advantageously increase the silicon-to-silicon bonding strength of the interface joinder of the N− upper wafer 110 and the carrier wafer 120, 270. As seen in the IC embodiment 202 of FIG. 10, moreover, the carrier wafer 120 has an N+ doping, and the silicided trenches are locally limited to the contact area with the emitter P+ collector structures 212. The silicide 216 makes an electrical short between the corresponding P+ emitter 212 and the adjacent portions of the N+ carrier wafer 120. Thus, the embodiments of FIGS. 10 and 11 do not require silicide across the entire wafer as in certain implementations of the IC 100 of FIG. 1 above, and also do not require implantation processing to form the IGBT emitter's 212, 282 or shorting contacts 214, 284.

Figure 12:
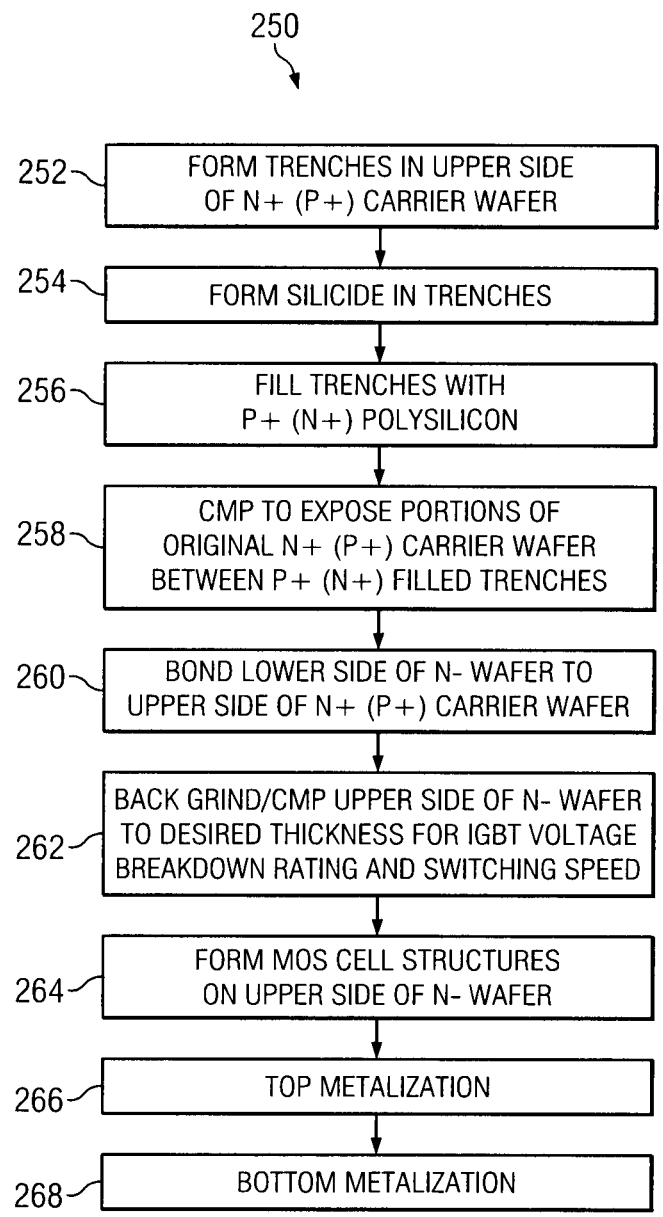
FIG. 12 is a flow diagram illustrating an exemplary process for making the integrated circuit of FIGS. 10 and 11.
Figure 13:
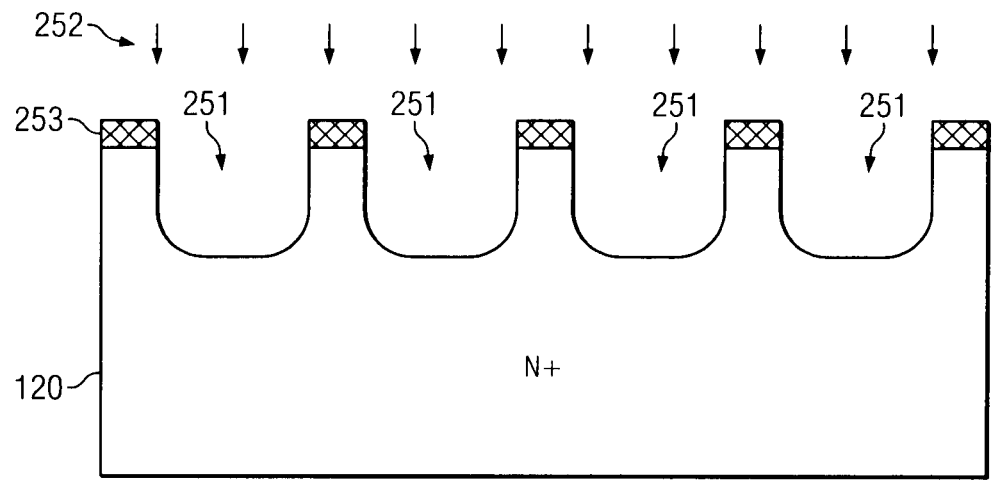
FIGS. 13-19 are partial sectional side elevation views illustrating the integrated circuit of FIG. 10, depicted in successive stages of fabrication.
Figure 14:
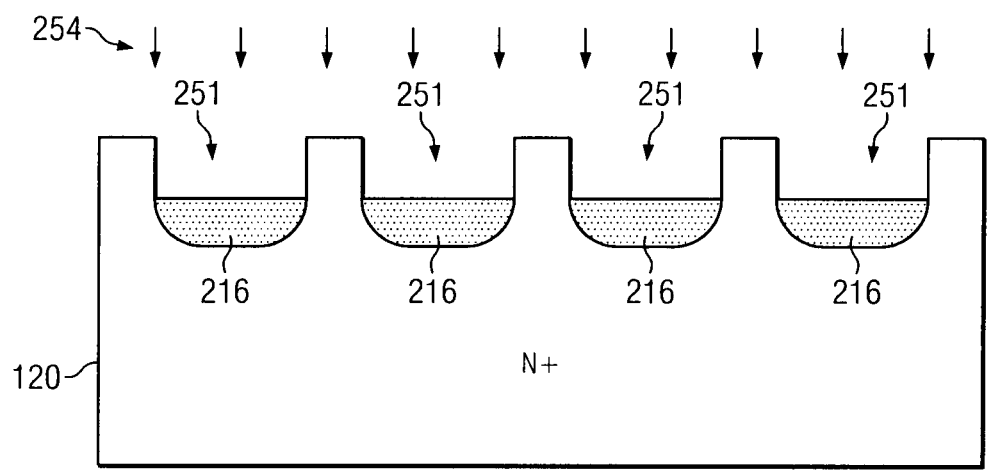

FIG. 12 illustrates a fabrication process 250 which can be used to manufacture the integrated circuits 202, 272 of FIGS. 10 and 11, and FIGS. 13-19 illustrate fabrication of the IC 202 of FIG. 10 (using an N+ carrier wafer 120), where similar/complementary processing can be used to form the alternate embodiment 272 of FIG. 11 with a P+ carrier 270. The process 250 in FIG. 12 begins at 252 with formation of a plurality of trenches (e.g., trenches 251 in FIG. 13) in an upper side of the N− carrier wafer structure 120 (P+ carrier wafer 270 would be used in fabricating the IC 272 of FIG. 11). Any suitable trench formation techniques may be employed to provide the trenches 251. For instance, an etch mask 253 may be formed as shown in FIG. 13 using suitable deposition, exposure, development, cleaning techniques, etc., followed by an etch process to selectively remove portions of the upper side of the N+ carrier wafer 120 to form the trenches 251 to any suitable depths, such as about 1-5 μm in one embodiment. At 254 in FIG. 12, silicide is formed in the trenches, such as formation of silicide layers 216 in FIG. 14 at the bottoms of the trenches 251. Any suitable processing can be performed at 254 to form the silicide 216. In one possible example, nitride is deposited over the upper side of the carrier wafer 120 after formation of the trenches 251, and the nitride is etched using an isotropic nitride etch process (not shown) leaving nitride on the sidewalls of the trenches 251 while removing the nitride from the trench bottoms. Thereafter, titanium or tungsten or other suitable metal is deposited, such as by sputtering, followed by heating to a certain temperature (e.g., 800-900° C.) to initiate a reaction to create the silicide 216 in the bottoms of the trenches 251 where the nitride has been removed. The silicide 216, moreover, can be formed to any suitable thickness, such as about several hundred angstroms on the trench bottoms in one embodiment, where a certain amount of silicide may, but need not be, present along all or portions of the trench sidewalls. Thereafter, any remaining unreacted metal and the nitride are removed by suitable cleaning steps, to leave the silicide 216 in the trench bottoms as shown in FIG. 13.

Figure 15:
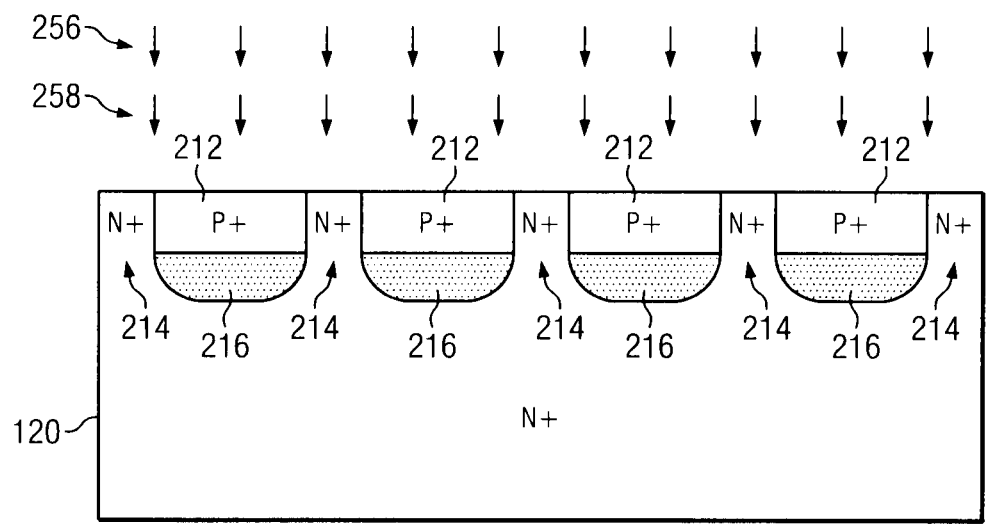

Thereafter at 256 (FIG. 12), P+ polysilicon is formed over the silicide layers 216 in the trenches 251, as seen in FIG. 15 (N+ polysilicon would be used for the IC embodiment 272 shown in FIG. 11). The polysilicon formation at 256 may continue to the point where the P+ polysilicon extends above the tops of the trenches 251, and a CMP or other material removal process can thus be performed at 258 (FIG. 15) to provide a smooth upper surface exposing portions 214 of the original N+ carrier wafer 120 between the P+ polysilicon-filled trenches 212.

Figure 16:
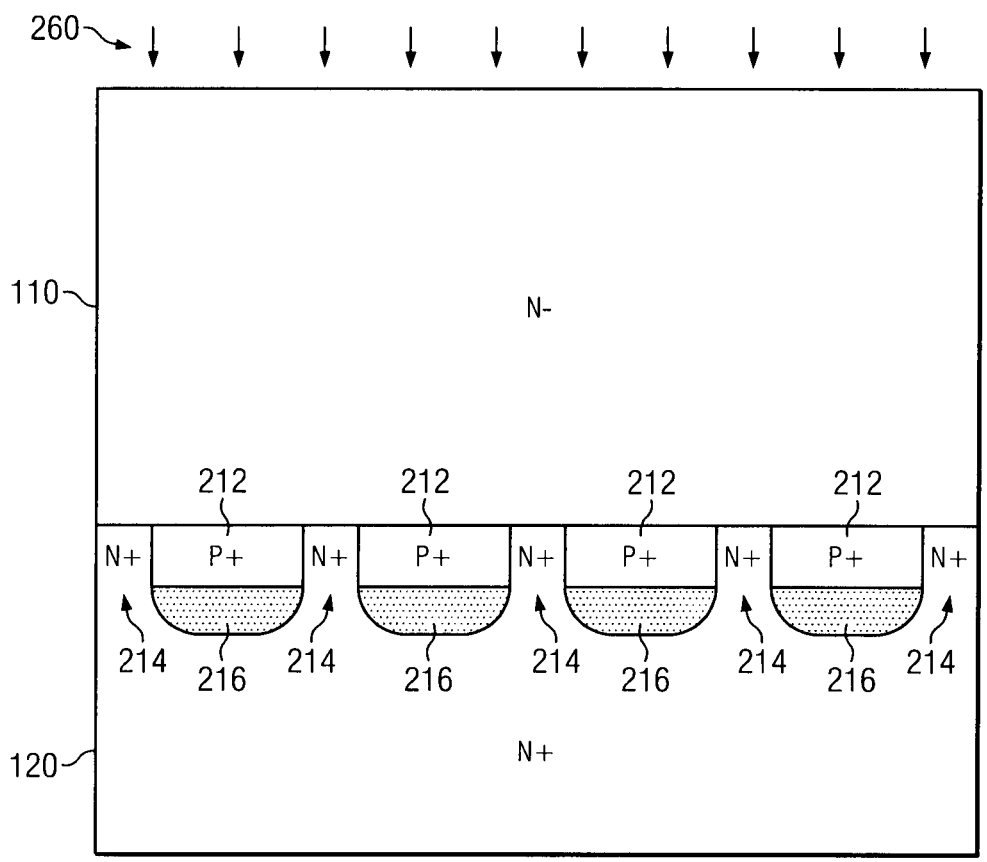

As seen in FIG. 16, a wafer bonding process 260 is used to join the lower side of an N− upper wafer 110 to the upper side of the N+ carrier wafer 120, wherein any suitable joining process can be used, such as the previously described low-temperature hydrophobic bonding process (e.g., at 160 in FIG. 2 above).

Figure 17:
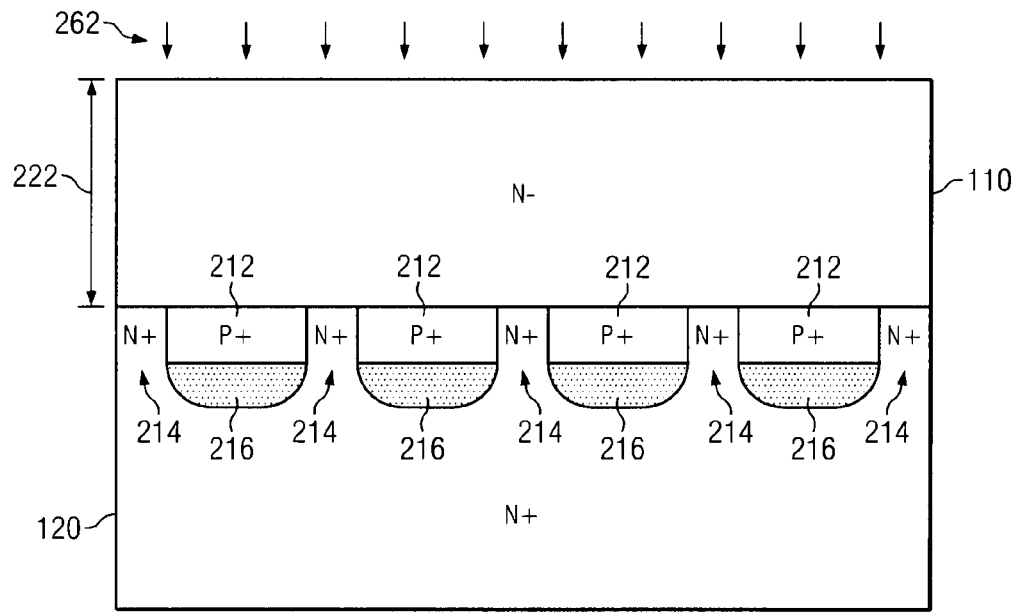
Figure 18:
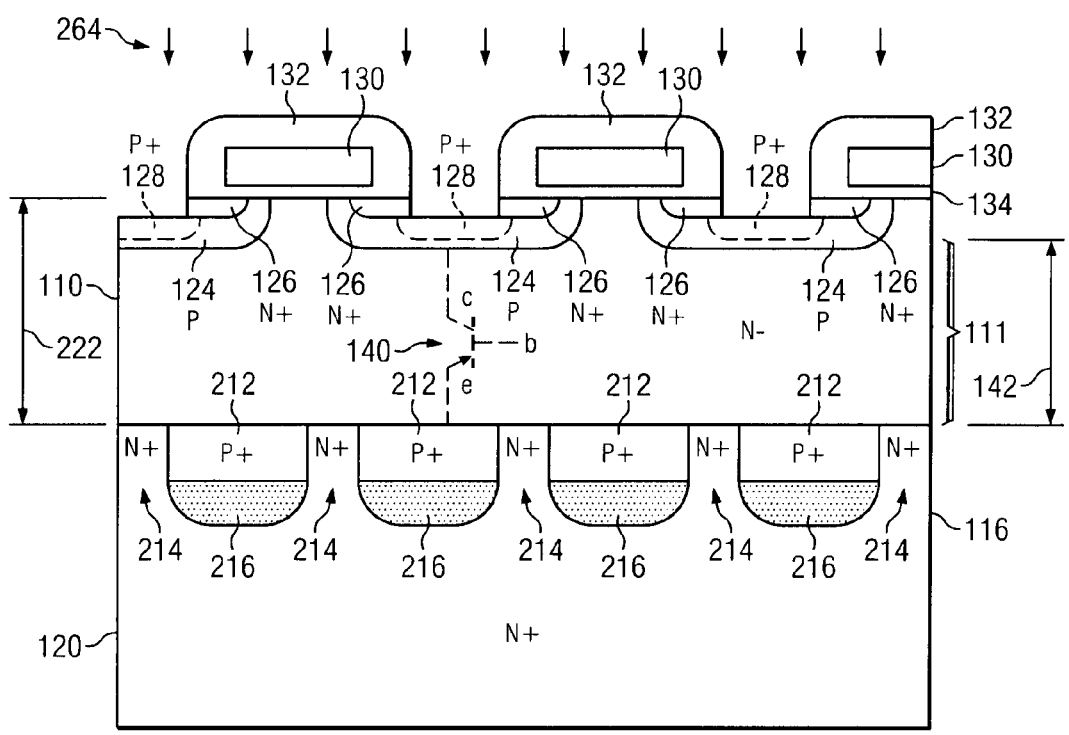

At 262 in the process 250 of FIG. 12, the thickness of the N− upper wafer 110 is reduced by removing a portion of the upper side to leave a remaining upper wafer thickness 222 in FIG. 17, such as about 100 μm or less in certain embodiments. Any suitable grinding, CMP or other material removal processing can be employed at 262, such as those described at 162 in FIG. 2 above. The upper wafer thickness 222 can be tailored to a given switching speed target, to thereby set the final device drift region thickness 142 as discussed above in connection with FIGS. 10 and 11 (e.g., to provide a drift region thickness 142 less than about 100 μm in certain embodiments, about 50 μm in certain embodiments, about 40-50 μm in further embodiments).

Figure 19:
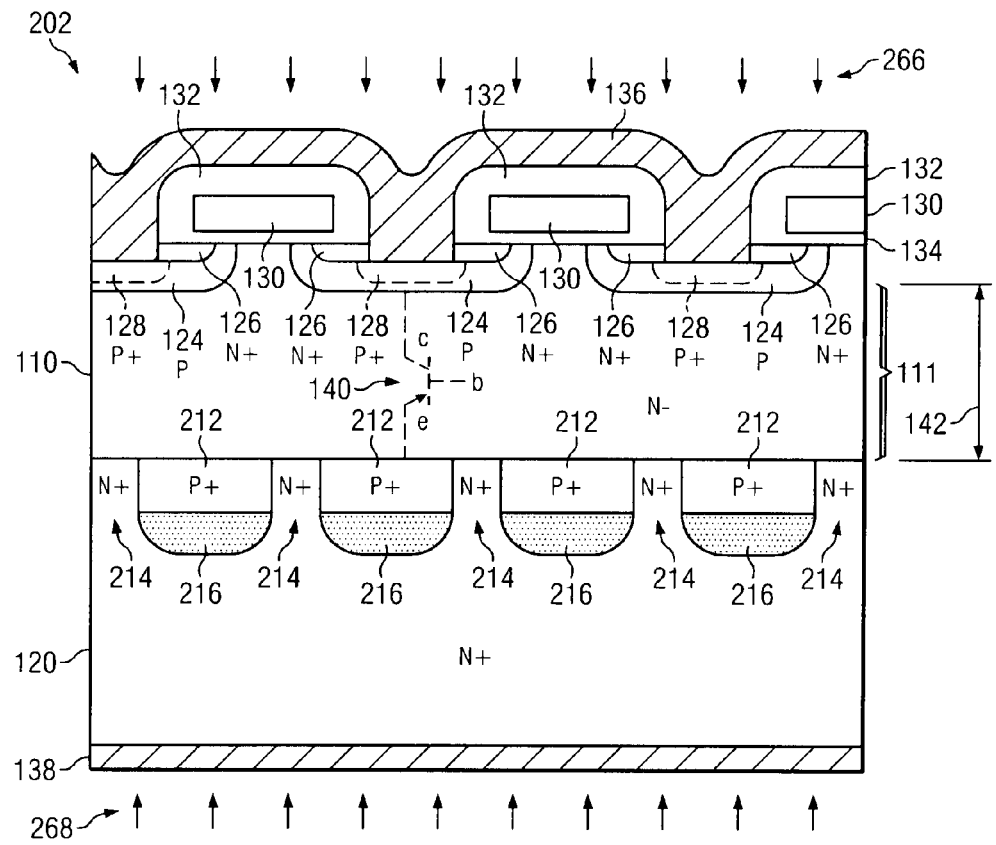

At 264, the MOS cell structures (FIG. 18) are formed in the upper side of the remaining N-wafer 110 to create N+ source zones 126, P body zones 124, P+ regions 128 and the gate structures including the gate contact 130 by any suitable processes, such as those described above at 164 in FIG. 2. Thereafter, top and bottom metallization processing is performed at 266 and 268, respectively, as seen in FIG. 19 (e.g., which may use processing as described at 166 and 168 in connection with FIG. 2 above). In this regard, the MOS processing at 264 and subsequent metallization processing may in certain embodiments be limited to around 950-1000° C. to avoid damaging the silicide 216 in the trench bottoms.

Figure 20:
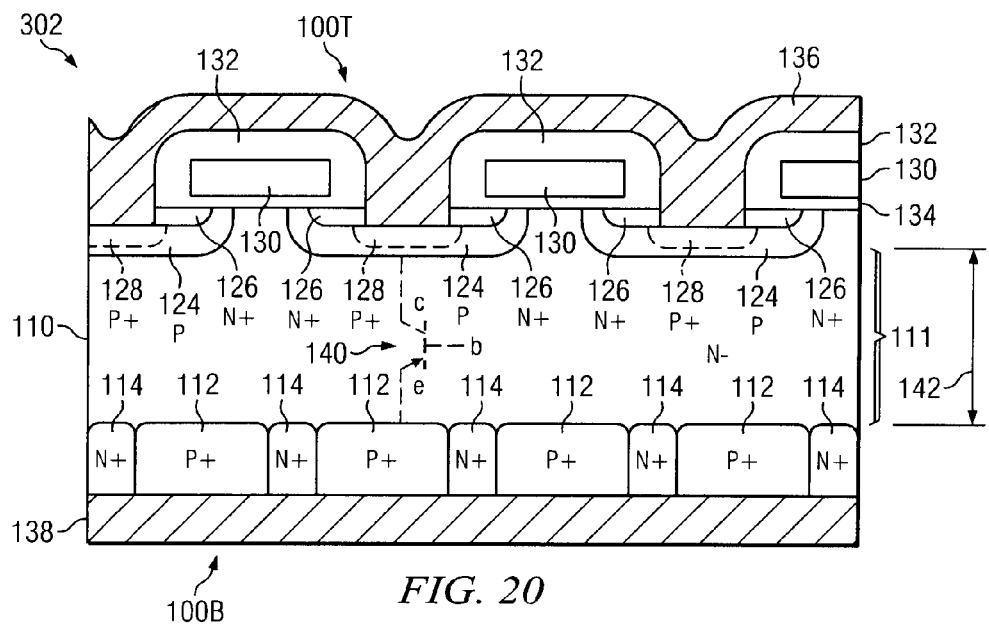
FIG. 20 is a partial sectional side elevation view illustrating another embodiment of an integrated circuit with an IGBT having emitter shorting contacts formed at the bottom of an upper wafer according to principles of the present disclosure.

Referring now to FIGS. 20-27, a fourth embodiment of an integrated circuit 302 is illustrated (FIG. 20) in which P+ emitters 112 and N+ shorting contacts 114 are formed in an upper N− wafer 110, followed by bonding to a sacrificial lower carrier wafer 120 (not shown in FIG. 20). MOS structures are then built in/on an upper side of the upper wafer 110, followed by back grinding to expose the emitters 112 and shorting contacts 114 before metallization processing. As seen in FIG. 20, the resulting IC 302 provides an IGBT structure as generally described with respect to the IC 100 in FIG. 1 with an anode metal layer 138 formed along the lower side of the upper wafer 110 with the emitter zones 112 extending between the drift zone 111 and the anode metal layer 138. This approach advantageously avoids the use of silicide, and thereby permits use of higher temperature MOS processing in forming the source, gate and body regions.

Figure 21:
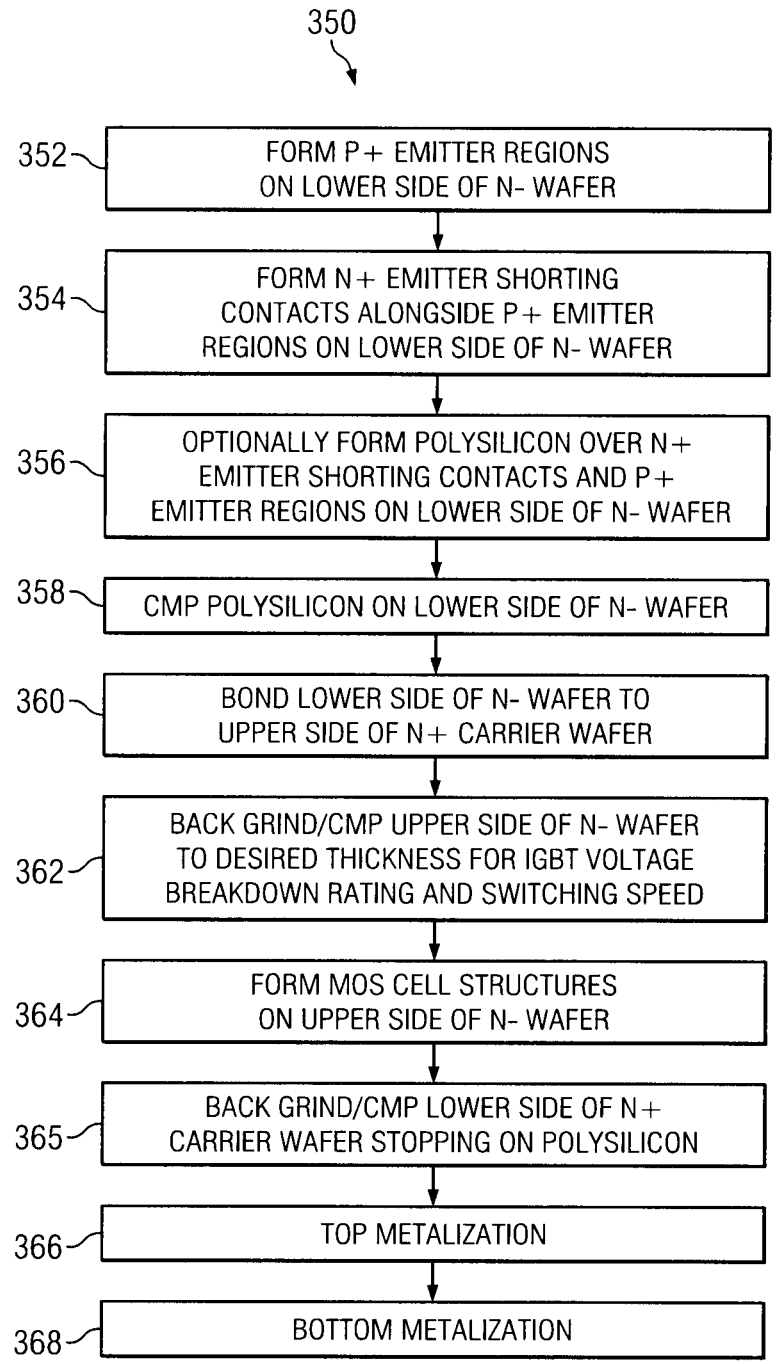
FIG. 21 is a flow diagram illustrating an exemplary process for making the integrated circuit of FIG. 20.

FIG. 21 depicts a process 350 for making the IC 302, with FIGS. 22-27 further illustrating various stages of the fabrication process 350. The fabrication begins at 352 in FIG. 21 with formation of P+ emitter regions 112, and formation of N+ emitter shorting contacts 114 alongside the emitters 112 on the lower side of the N− wafer 110 at 354. Any suitable processing techniques can be used to form the emitter and shorting contact regions 112, 114, for example, the implantation processes illustrated and described above in connection with steps 152 and 154 of FIGS. 3-5 above.

Figure 22:
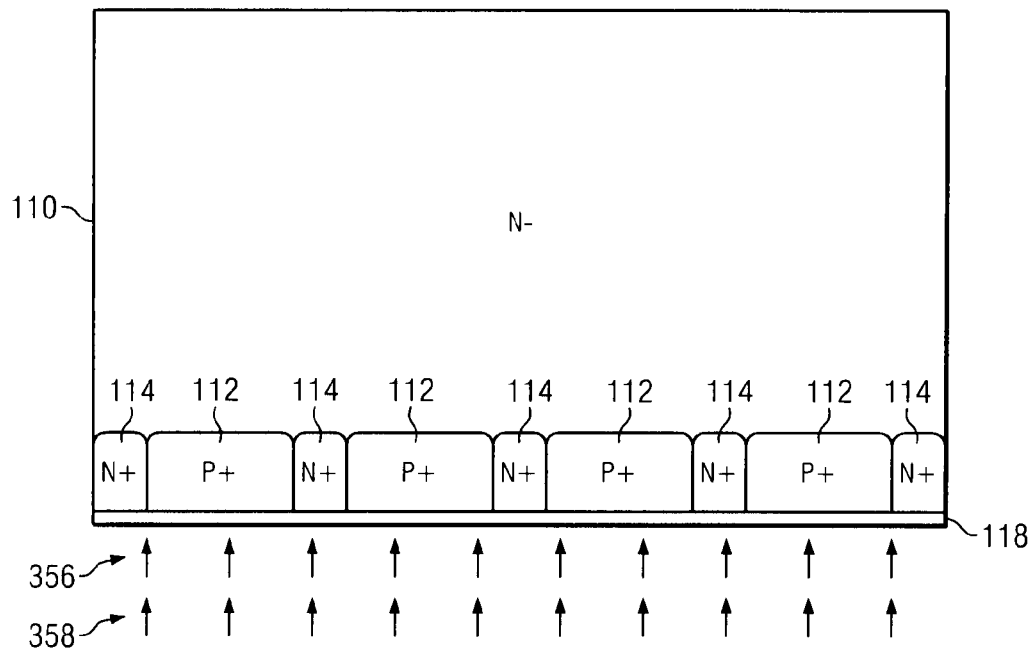
FIGS. 22-27 are partial sectional side elevation views illustrating the integrated circuit of FIG. 20, depicted in successive stages of fabrication.
Figure 23:
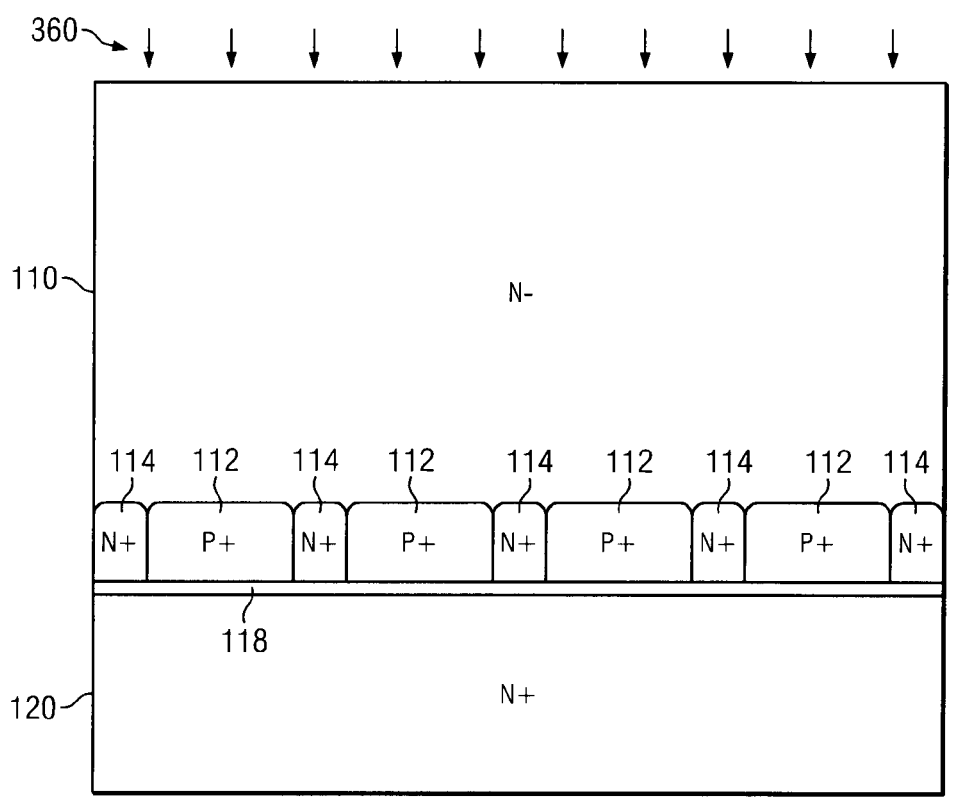

At 356 in FIG. 21, an optional polysilicon layer 118 (FIG. 22) is formed over the N+emitter shorting contacts 114 and the P+ emitter regions 112 on the lower side of the wafer 110, where the layer 118 may be formed using any suitable techniques, such as described above at 158 in FIGS. 2 and 5 (e.g., to a thickness of a few hundreds of angstroms in one embodiment). As seen below, the polysilicon layer 118 facilitates initial bonding of a lower N+ carrier wafer 120, and thereafter may also operate as a material removal stop layer. A CMP process is then performed at 358 to provide a smooth lower surface as shown in FIG. 22. At 360, an upper side of an N+ carrier wafer 120 is bonded to the lower side of the N-wafer 110 and any polysilicon layer 118 as shown in FIG. 23, for instance, using the wafer bonding processes described above.

Figure 24:
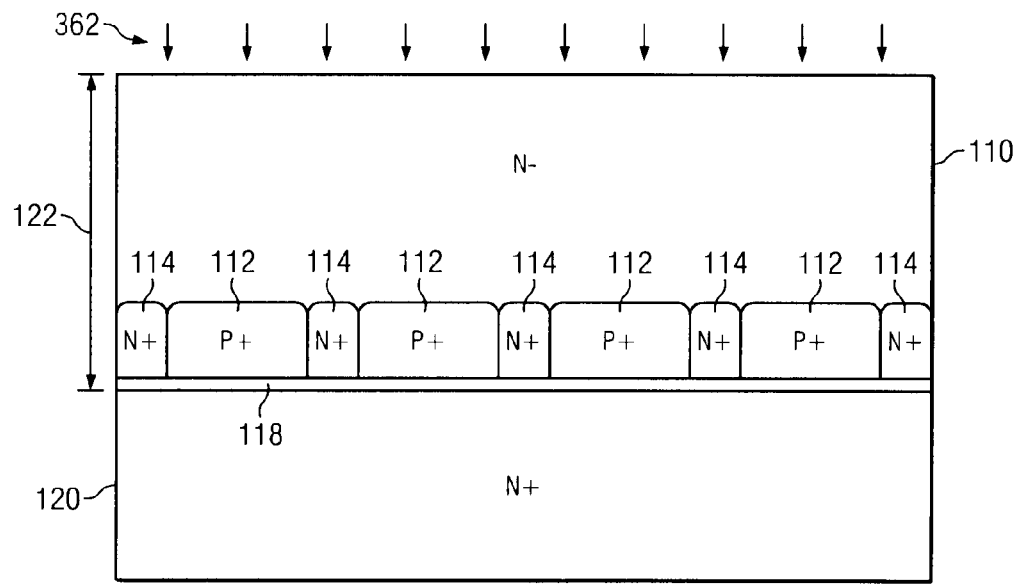
Figure 25:
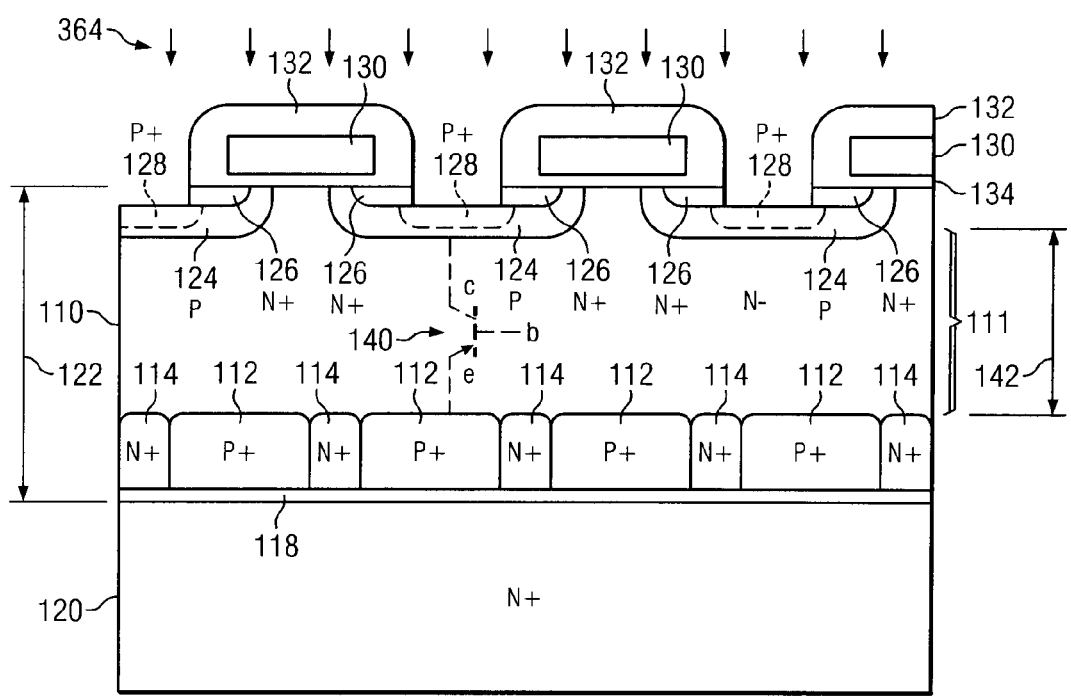
Figure 26:
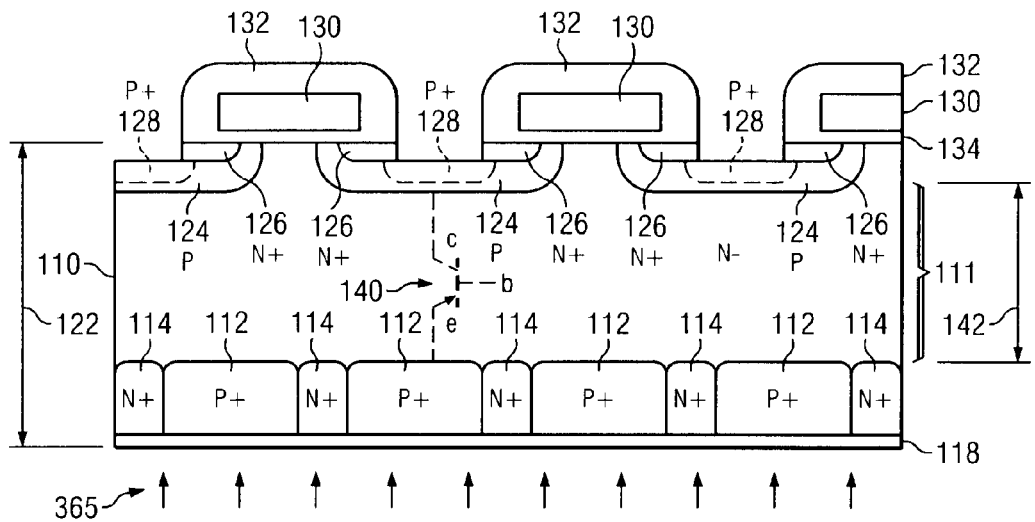

At 362, one or more material removal processes are performed, such as back grinding, CMP, etc., to remove material from the upper side of the N-wafer 110 as seen in FIG. 24. As in the above embodiments, the processing at 362 sets a remaining thickness 122 for the N-wafer 110 of about 105 μm or less in certain embodiments, which can be controlled to smaller dimensions in order to set a capability switching speed by controlling the depth 142 (e.g., 100 μm or less) of the drift region 111 (FIG. 20) of the resulting IGBT in the IC 302.

MOS cell structures are then formed at 364 (FIG. 25) on/in the upper side of the N− wafer 110, wherein the above-described MOS cell fabrication techniques can be used, without the temperature limitations associated with embodiments having silicide layers or regions.

Figure 27:
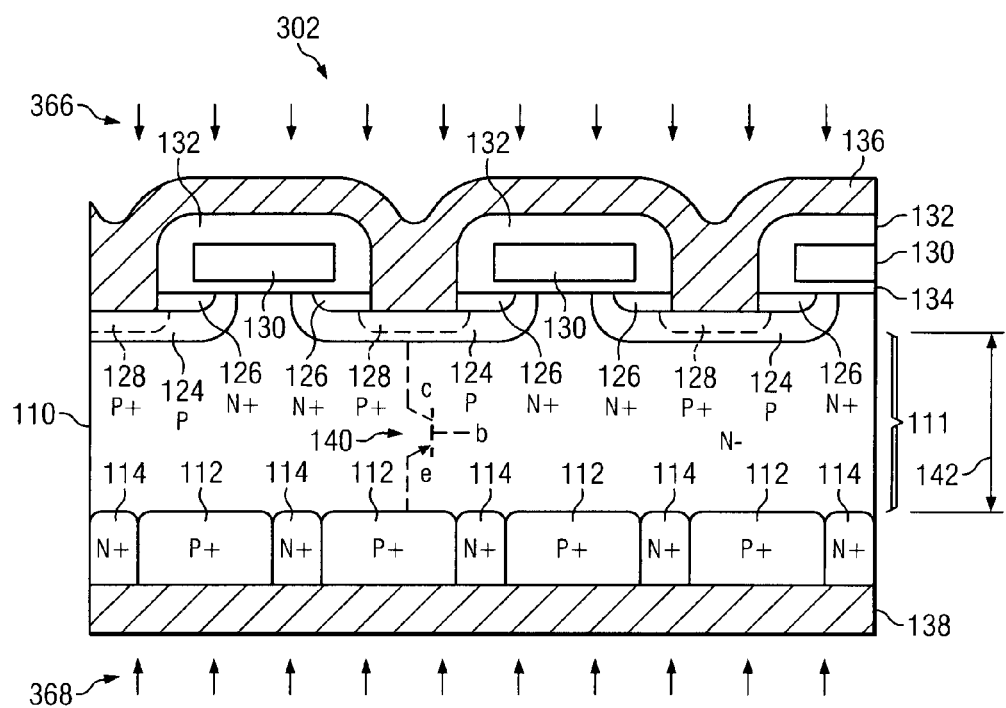

Another material removal processes performed at 365 (shown in FIG. 26) to remove substantially all of the lower side of the N+ carrier wafer 120, for example, stopping on the polysilicon layer 118. In this regard, the carrier wafer 120 may be entirely sacrificial, or a portion thereof may remain in various embodiments. Any suitable material removal technique or processes may be employed at 365, such as those described above. At 366 and 388, top and bottom metallization processes are performed as seen in FIG. 27 to provide the resulting IC 302 shown in FIG. 20 with a drift layer thickness 142 facilitating high voltage operation and with the emitter shorting contacts 114 facilitating fast IGBT switching operation.

Figure 28:
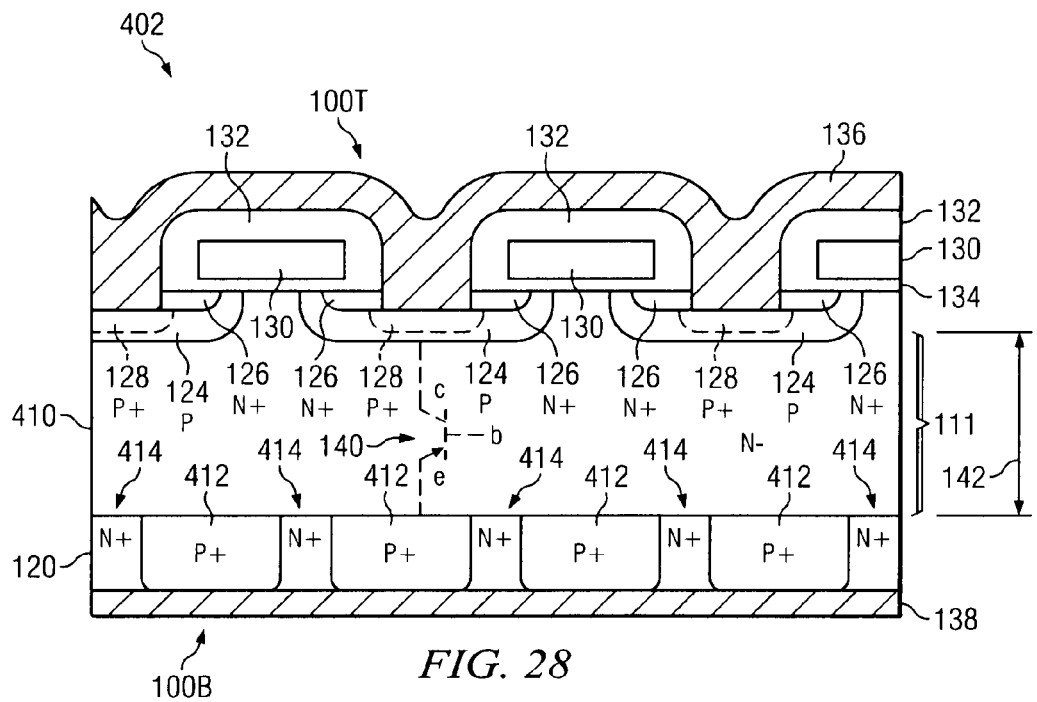
FIGS. 28 and 29 are partial sectional side elevation views illustrating further integrated circuit embodiments including an IGBT with emitter shorting contacts proximate the top of a carrier wafer according to principles of the present disclosure.
Figure 29:
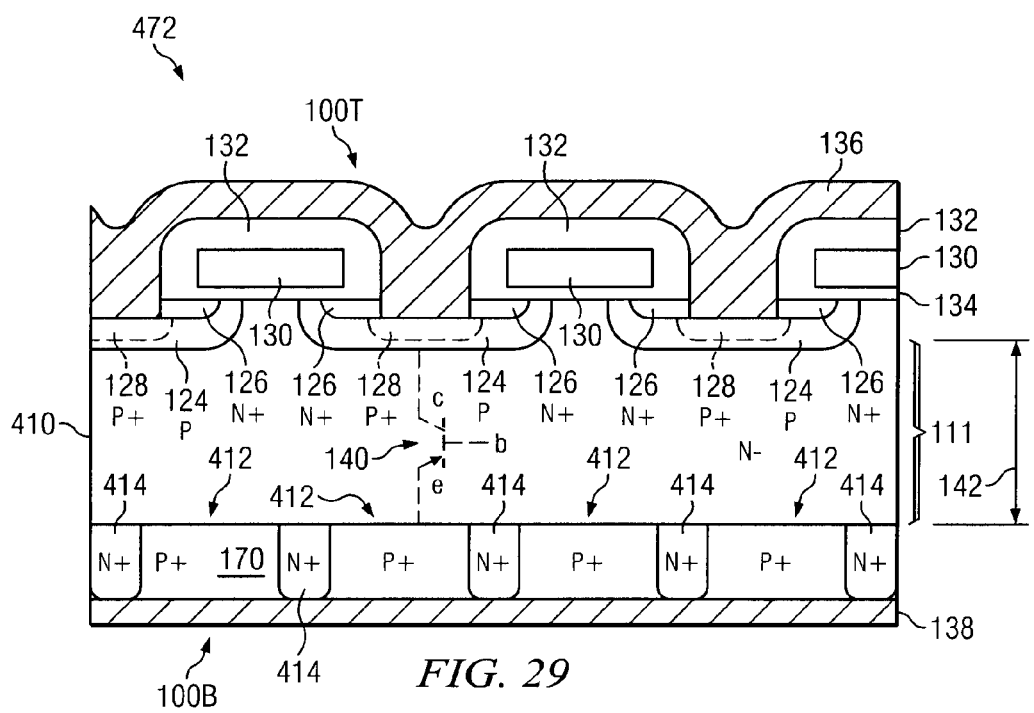
Figure 30:
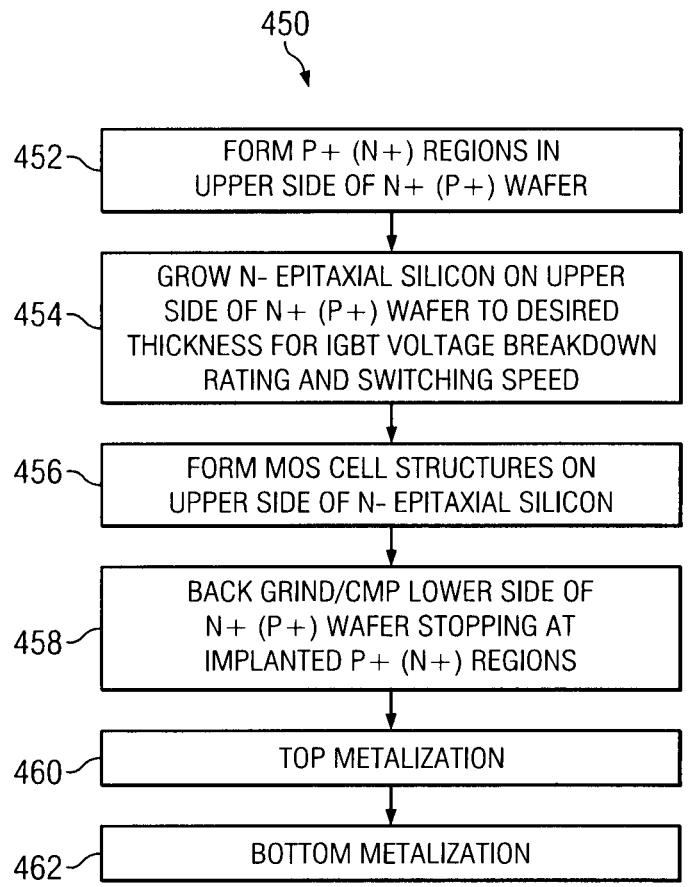
FIG. 30 is a flow diagram illustrating an exemplary process for making the integrated circuits of FIGS. 28 and 29.

Fifth and sixth embodiments 402 and 472 are shown in FIGS. 28 and 29, respectively, with FIG. 30 illustrating a process 450 for making the ICs 402 or 472, and FIGS. 31-35 showing various intermediary fabrication stages of the process 450 to form the IC 402. In these embodiments, emitters 412 and shorting contacts 414 are formed in the upper side of an N+ carrier structure 120 (a P+ carrier wafer 170 is used in the IC 472 of FIG. 29), and N− epitaxial silicon 410 is gown above the emitters 412 and shorting contacts 414. Also, the MOS cell structures are formed in/on the top of the epitaxial layer 410 prior to back grinding the bottom side of the carrier wafer 120, 170 to expose the bottoms of the emitters 412 and shorting contacts 414, followed by metallization processing. The resulting integrated circuits 402 and 472 provide IGBT operation as described above, with the epitaxial silicon thickness controlling the depth 142 of the drift region 111 for high voltage breakdown rating and with the shorting contacts 414 facilitating fast switching operation.

Figure 31:
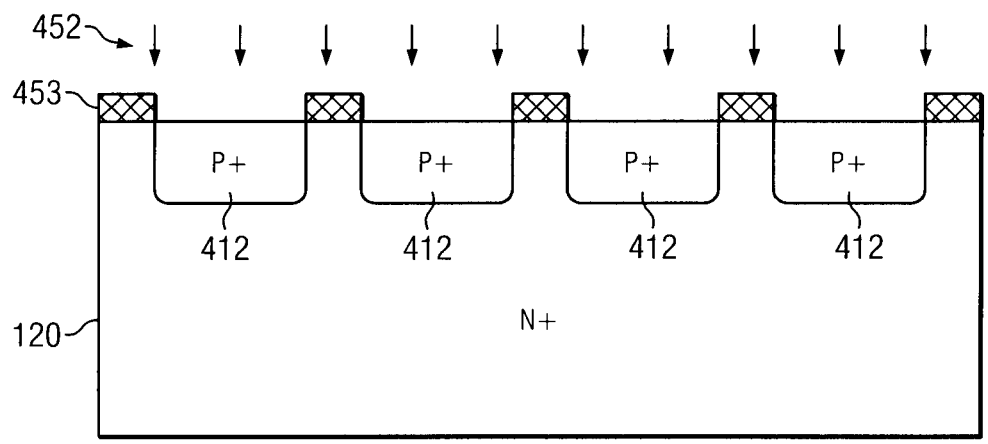
FIGS. 31-35 are partial sectional side elevation views illustrating the integrated circuit of FIG. 28, depicted in successive stages of fabrication.
Figure 32:
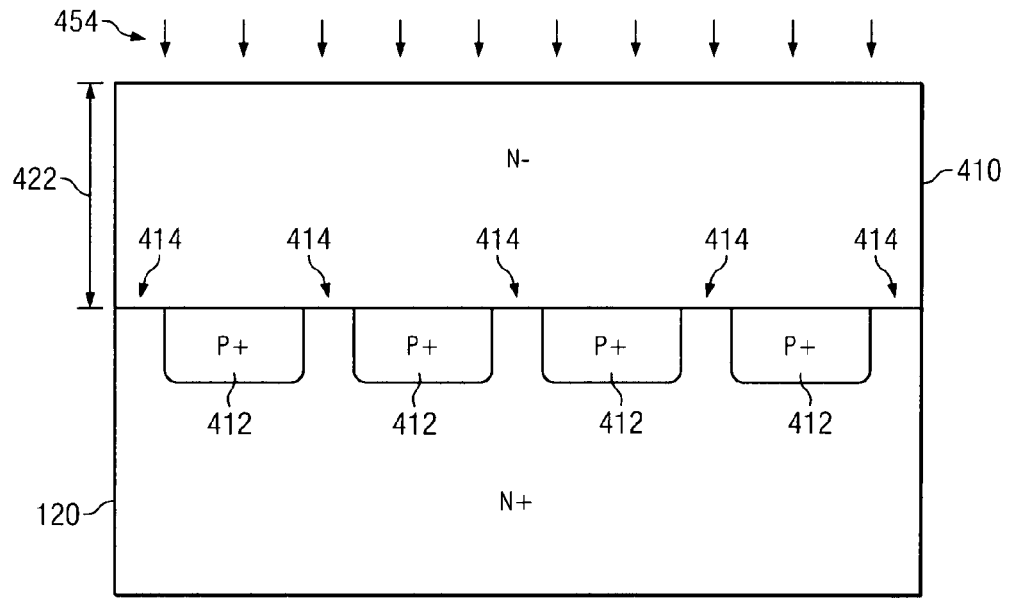
Figure 33:
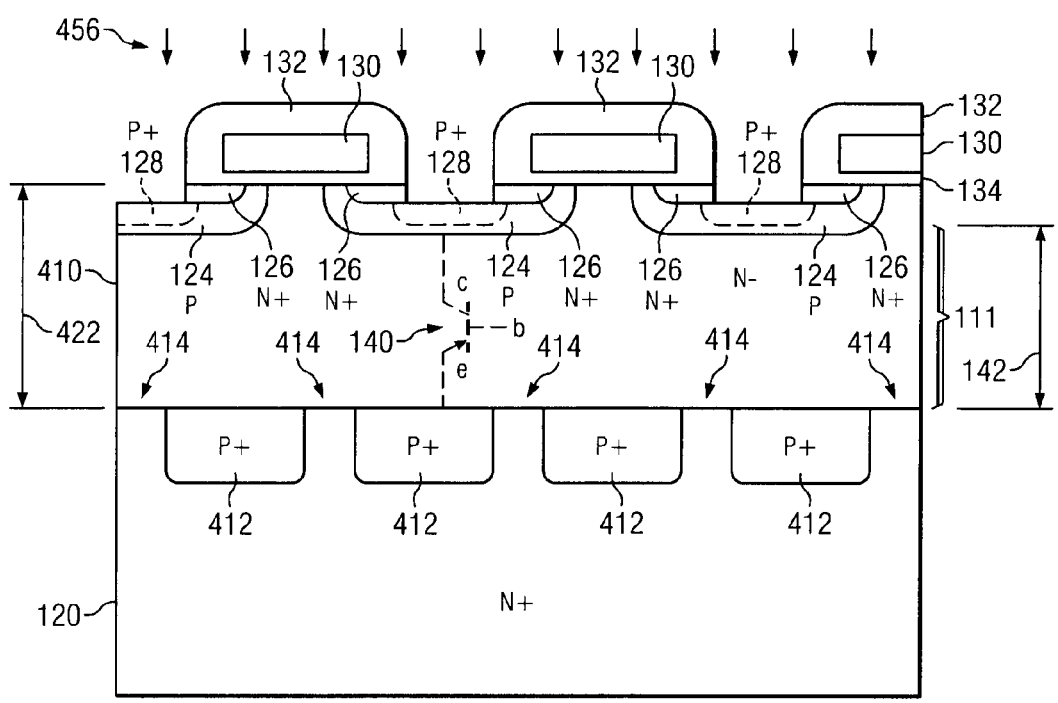

The fabrication processing begins at 452 in the process 450 of FIG. 30 by forming spaced P+ doped emitter regions 412 in an upper side of an N+ carrier wafer 120 is seen in FIG. 31, for example, using an implantation mask 453 and a suitable implantation process, such as the above described implantation process at 152 in FIGS. 2 and 3. N+ emitter shorting contact regions 414 are alternatively implanted at 452 into the P+ carrier wafer 170 for the IC embodiment 472 of FIG. 29. At 454, N− epitaxial silicon 410 is grown (FIG. 32) over the upper side of the carrier wafer 120 to a thickness 422 of about 100 μm or less, wherein the thickness 422 provided by the epitaxial growth processing at 454 can be tailored to provide a desired final sickness 142 of the IGBT drift layer 111 as in the above embodiments. In the alternate embodiment of FIG. 29, N-epitaxial silicon 410 is also formed at 454 in FIG. 30.

Figure 34:
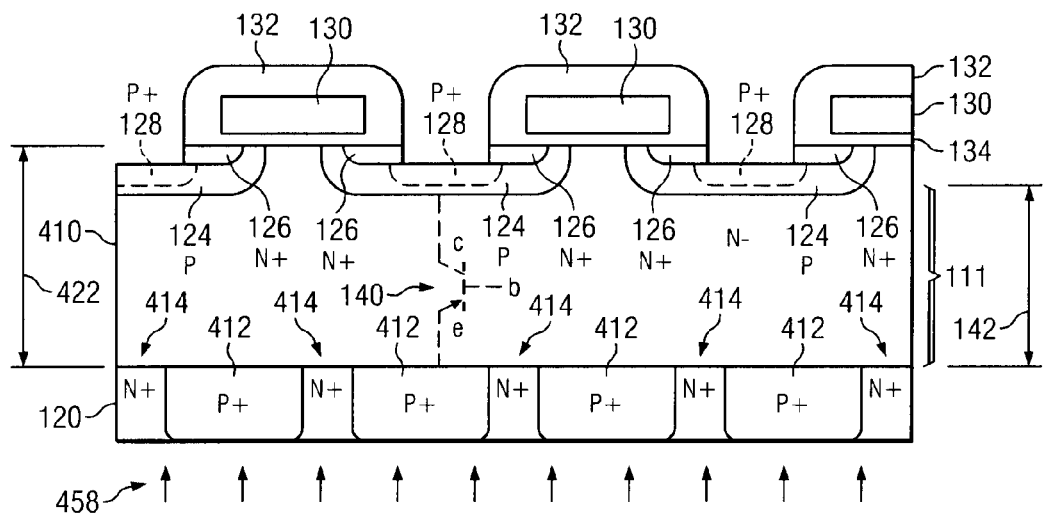
Figure 35:
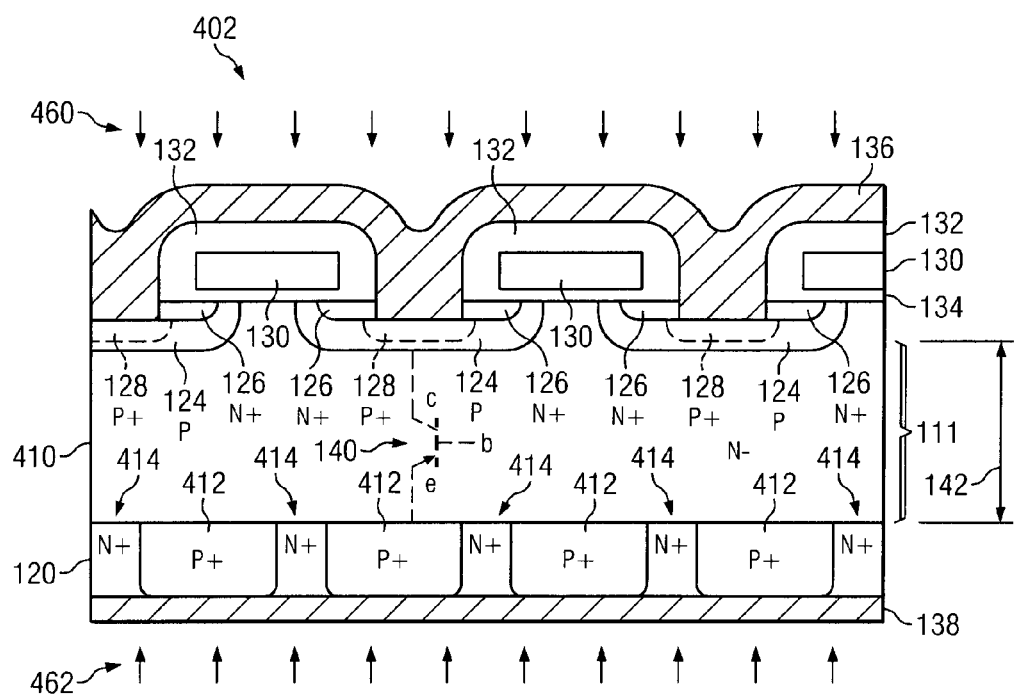

At 456, MOS cell structures are fabricated (FIG. 33) on the upper side of the N-epitaxial silicon 410 to form source zones 126, body zones 124, gate structures including insulated gate electrode 130, for instance, by processing as described above. The thickness of the carrier wafer 120 (or 170) is reduced at 458 using one or more material removal processes (e.g., as described above) to remove a portion of the lower side thereof, stopping when the implanted P+ emitters 412 (or implanted N+ emitter shorting contacts 414) are exposed as shown in FIG. 34. Thereafter, top and bottom metallization processes are performed at 460 and 462 as shown in FIG. 35 to provide the finished IC 402. These embodiments provide a trade-off between the expense of growing the epitaxial silicon layer 410 and the use of wafer bonding techniques as described above.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An integrated circuit, comprising:
a semiconductor body disposed between a top side and an opposite bottom side of the integrated circuit, the semiconductor body comprising a first wafer with an upper side proximate the top side of the semiconductor body and a second wafer with a lower side proximate the bottom side of the semiconductor body, the first and second wafers being joined to one another along an interface;
a plurality of emitter zones of a first conductivity type formed in the semiconductor body;
a drift zone of a second conductivity type formed in the semiconductor body proximate to the emitter zones, wherein the drift zone separates the plurality of emitter zones from the top side;
at least one transistor cell, comprising:
a source zone of the second conductivity type disposed in the semiconductor body,
a body zone of the first conductivity type disposed in the semiconductor body between the source zone and the drift zone, and
a gate electrode insulated with respect to the source zone and the body zone,
the transistor cell, the emitter zones, and the drift zone forming a vertical insulated gate bipolar transistor;
at least one emitter shorting contact of the second conductivity type disposed in the semiconductor body proximate at least one of the of emitter zones; and
a silicide layer disposed between the emitter zones and the interface.

2. The integrated circuit of claim 1, wherein the emitter zones and the at least one emitter shorting contact are formed in the first wafer proximate the interface.

3. The integrated circuit of claim 1, comprising a polysilicon layer disposed between the silicide layer and the interface.

4. The integrated circuit of claim 1, wherein the drift zone has a thickness less than about 100 μm.

5. An integrated circuit, comprising:
a semiconductor body disposed between a top side and an opposite bottom side of the integrated circuit, the semiconductor body comprising a first wafer with an upper side proximate the top side of the semiconductor body and a second wafer with a lower side proximate the bottom side of the semiconductor body, the first and second wafers being joined to one another along an interface;
a plurality of emitter zones of a first conductivity type formed in the semiconductor body;

a drift zone of a second conductivity type formed in the semiconductor body proximate to the emitter zones, wherein the drift zone separates the plurality of emitter zones from the top side;
at least one transistor cell, comprising:
a source zone of the second conductivity type disposed in the semiconductor body,
a body zone of the first conductivity type disposed in the semiconductor body between the source zone and the drift zone, and
a gate electrode insulated with respect to the source zone and the body zone,
the transistor cell, the emitter zones, and the drift zone forming a vertical insulated gate bipolar transistor; and
at least one emitter shorting contact of the second conductivity type disposed in the semiconductor body proximate at least one of the of emitter zones:
wherein the emitter zones and the at least one emitter shorting contact are formed in the second wafer proximate the interface;
wherein the second wafer of the semiconductor body is of the second conductivity type; and
wherein the emitter zones comprise polysilicon of the first conductivity type disposed in the second wafer proximate the interface.

6. The integrated circuit of claim 5, comprising a plurality of silicide regions individually in contact with corresponding ones of the emitter zones, wherein the individual emitter zones are disposed in the second wafer between the corresponding silicide region and the interface.

7. The integrated circuit of claim 5, comprising an anode metal layer formed along the lower side of the second wafer of the semiconductor body, wherein the emitter zones individually extend substantially between the interface and the anode metal layer.

8. An integrated circuit, comprising:
a semiconductor body disposed between a top side and an opposite bottom side of the integrated circuit, the semiconductor body comprising a first wafer with an upper side proximate the top side of the semiconductor body and a second wafer with a lower side proximate the bottom side of the semiconductor body, the first and second wafers being joined to one another along an interface;
a plurality of emitter zones of a first conductivity type formed in the semiconductor body;
a drift zone of a second conductivity type formed in the semiconductor body proximate to the emitter zones, wherein the drift zone separates the plurality of emitter zones from the top side;
at least one transistor cell, comprising:
a source zone of the second conductivity type disposed in the semiconductor body,
a body zone of the first conductivity type disposed in the semiconductor body between the source zone and the drift zone, and
a gate electrode insulated with respect to the source zone and the body zone,
the transistor cell, the emitter zones, and the drift zone forming a vertical insulated gate bipolar transistor; and
at least one emitter shorting contact of the second conductivity type disposed in the semiconductor body proximate at least one of the of emitter zones:
wherein the emitter zones and the at least one emitter shorting contact are formed in the second wafer proximate the interface;
wherein the second wafer of the semiconductor body is of the first conductivity type; and
wherein the at least one emitter shorting contact comprises polysilicon of the second conductivity type disposed in the second wafer proximate the interface.

9. The integrated circuit of claim 8, comprising at least one silicide region in contact with the at least one emitter shorting contact, wherein the at least one emitter shorting contact is disposed in the second wafer between the at least one silicide region and the interface.

10. The integrated circuit of claim 8, comprising an anode metal layer formed along the lower side of the second wafer of the semiconductor body, wherein the at least one emitter shorting contact extends substantially between the interface and the anode metal layer.

* * * * *